US012751064B2

(12) United States Patent
Lee et al.

(10) Patent No.: US 12,751,064 B2

(45) Date of Patent: Sep. 29, 2026

(54) SEMICONDUCTOR DEVICE WITH ACTIVE LAYERS DOPED BY SACRIFICIAL LAYERS AND METHOD THEREOF

(71) Applicant: Samsung Electronics Co., Ltd., Suwon-si (KR)

(72) Inventors: Sangmoon Lee, Suwon-si (KR); Jinbum Kim, Suwon-si (KR); Dongwoo Kim, Suwon-si (KR); Hyojin Kim, Suwon-si (KR); Yongjun Nam, Suwon-si (KR); Ingeon Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 666 days.

(21) Appl. No.: 18/176,170

(22) Filed: Feb. 28, 2023

(65) Prior Publication Data

US 2024/0021704 A1 Jan. 18, 2024

(30) Foreign Application Priority Data

Jul. 14, 2022 (KR) ........................ 10-2022-0087109

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC ............. H10D 64/017; H10D 30/6735; H10D 30/6748; H10D 84/038; H10D 84/0167; H10D 30/62
See application file for complete search history.

(56) References Cited

U.S. PATENT DOCUMENTS 8,343,838 B2 1/2013 Koester
10,008,583 B1 6/2018 Rodder et al.
(Continued)

FOREIGN PATENT DOCUMENTS

CN 113130629 A * 1/2020 ......... H10D 84/0128

*Primary Examiner* — Davienne N Monbleau
*Assistant Examiner* — Heim Kirin Grewal
(74) *Attorney, Agent, or Firm* — Fish & Richardson P.C.

(57) ABSTRACT

A semiconductor device includes a substrate including an active pattern, a channel pattern including a plurality of semiconductor patterns spaced apart from each other and vertically stacked, on the active pattern, a source/drain pattern connected to the plurality of semiconductor patterns, and a gate electrode including a first inner electrode provided below a first semiconductor pattern among the plurality of semiconductor patterns, on the plurality of semiconductor patterns, and a second inner electrode provided above the first semiconductor pattern, the first semiconductor pattern includes a first portion adjacent to the first inner electrode, a second portion adjacent to the second inner electrode, and a third portion between the first and second portions, the first semiconductor pattern includes a dopant having an atomic weight greater than that of silicon, and a dopant concentration of the third portion is smaller than a dopant concentration of each of the first and second portions.

14 Claims, 25 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/834*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ..... *H10D 30/6735* (2025.01); *H10D 30/6748* (2025.01); *H10D 30/6757* (2025.01); *H10D 62/121* (2025.01); *H10D 62/834* (2025.01); *H10D 84/0167* (2025.01); *H10D 84/038* (2025.01); *H10D 84/85* (2025.01)

(56) References Cited

U.S. PATENT DOCUMENTS

| | | | | |
|---|---|---|---|---|
| 10,319,863 | B2 | 6/2019 | Lee et al. | |
| 11,069,577 | B2 | 7/2021 | Cheng et al. | |
| 11,152,338 | B2 | 10/2021 | Wu et al. | |
| 11,183,561 | B2 | 11/2021 | Cheng et al. | |
| 2019/0221649 | A1* | 7/2019 | Glass | H10D 30/6211 |
| 2020/0044087 | A1* | 2/2020 | Guha | H10D 30/6217 |
| 2020/0144396 | A1 | 5/2020 | Cheng et al. | |
| 2021/0098627 | A1* | 4/2021 | Liaw | H10D 30/014 |
| 2021/0202697 | A1* | 7/2021 | Young | H10D 30/6735 |
| 2021/0217860 | A1* | 7/2021 | Ha | H10D 84/0128 |
| 2021/0328012 | A1* | 10/2021 | Tsai | H10D 30/014 |
| 2022/0085007 | A1 | 3/2022 | Lee et al. | |
| 2022/0093613 | A1* | 3/2022 | Moriwaki | H10D 30/6735 |
| 2022/0359768 | A1* | 11/2022 | Chang | H10D 30/6735 |
| 2023/0065708 | A1* | 3/2023 | Ko | H10D 84/0135 |

* cited by examiner

SEMICONDUCTOR DEVICE WITH ACTIVE LAYERS DOPED BY SACRIFICIAL LAYERS AND METHOD THEREOF

CROSS-REFERENCE TO RELATED APPLICATIONS

This U.S. non-provisional patent application claims priority under 35 U.S.C. § 119 to Korean Patent Application No. 10-2022-0087109, filed on Jul. 14, 2022, in the Korean Intellectual Property Office, the contents of which are hereby incorporated by reference in its entirety.

BACKGROUND OF THE INVENTION

The inventive concepts relate to a semiconductor device and a method of manufacturing the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. Scaling down MOSFETs may deteriorate operating characteristics of the semiconductor device. Accordingly, various research has been conducted to develop methods of fabricating semiconductor devices having superior performance while overcoming issues associated with high integration of the semiconductor devices.

SUMMARY

Some example embodiments provide a semiconductor device having improved reliability and electrical characteristics.

Some example embodiments provide a method of manufacturing a semiconductor device with improved process efficiency.

Some example embodiments provide a method of manufacturing a semiconductor device having improved reliability and electrical characteristics.

A semiconductor device according to some example embodiments of the inventive concepts may include a substrate including an active region and a dummy region, an active pattern on the active region and a dummy pattern on the dummy region, a channel pattern and a source/drain pattern on the active pattern, the channel pattern including a plurality of semiconductor patterns spaced apart from each other and vertically stacked, a dummy stacked pattern on the dummy pattern, the dummy stacked pattern horizontally spaced apart from the channel pattern and the source/drain pattern, and the dummy stacked pattern including a plurality of dummy sacrificial layers and a plurality of dummy layers, wherein the plurality of dummy sacrificial layers and the plurality of dummy layers are alternately stacked, and a gate electrode on the plurality of semiconductor patterns, the gate electrode including an inner electrode interposed between adjacent semiconductor patterns among the plurality of semiconductor patterns, and each of the plurality of dummy sacrificial layers may include a dopant having an atomic weight greater than an atomic weight of each of silicon-germanium (SiGe) and silicon (Si), and a concentration of the dopant may be $1.0\times10^{19}$ atoms/cm$^3$ to $1.0\times10^{21}$ atoms/cm$^3$.

A semiconductor device according to some example embodiments of the inventive concepts may include a substrate including an active pattern, a channel pattern on the active pattern, the channel pattern including a plurality of semiconductor patterns spaced apart from each other and vertically stacked, a source/drain pattern connected to the plurality of semiconductor patterns, and a gate electrode on the plurality of semiconductor patterns, the gate electrode including a first inner electrode provided below a first semiconductor pattern among the plurality of semiconductor patterns, and a second inner electrode provided above the first semiconductor pattern, the first semiconductor pattern may include a first portion adjacent to the first inner electrode, a second portion adjacent to the second inner electrode, and a third portion between the first portion and the second portion, the first semiconductor pattern may include a dopant having an atomic weight greater than an atomic weight of silicon (Si), and a dopant concentration of the third portion may be smaller than a dopant concentration of each of the first and second portions.

A method of manufacturing a semiconductor device according to some example embodiments of the inventive concepts may include forming a stacked pattern on a substrate, the forming of the stacked pattern including alternately forming active layers and sacrificial layers on each other, forming a sacrificial pattern extending in a first direction on the stacked pattern, etching the stacked pattern using the sacrificial pattern as a mask to form recesses in the stacked pattern, the active layers including a plurality of semiconductor patterns exposed by the recesses, forming a source/drain pattern connected to the plurality of semiconductor patterns exposed by the recesses, removing the sacrificial pattern and the sacrificial layers to expose the plurality of semiconductor patterns, and sequentially forming a gate insulating layer and a gate electrode on the exposed plurality of semiconductor patterns, and the forming of the sacrificial layers may include doping a dopant having an atomic weight greater than an atomic weight of silicon (Si) at a dose of $1.0\times10^{19}$ atoms/cm$^2$ to $1.0\times10^{22}$ atoms/cm$^2$.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
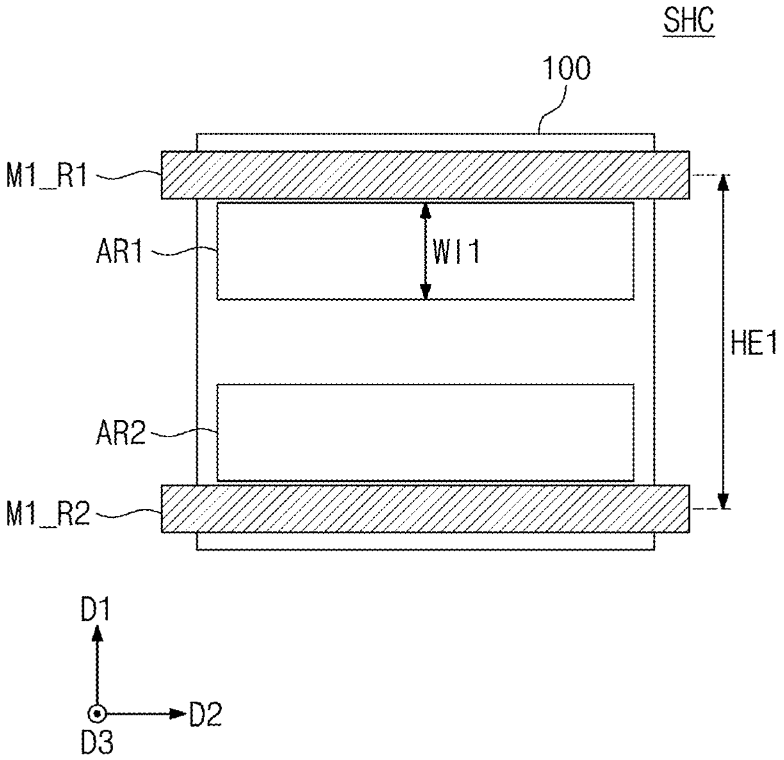
FIGS. 1 to 3 are conceptual views illustrating logic cells of a semiconductor device according to some example embodiments of the inventive concepts.
Figure 2:
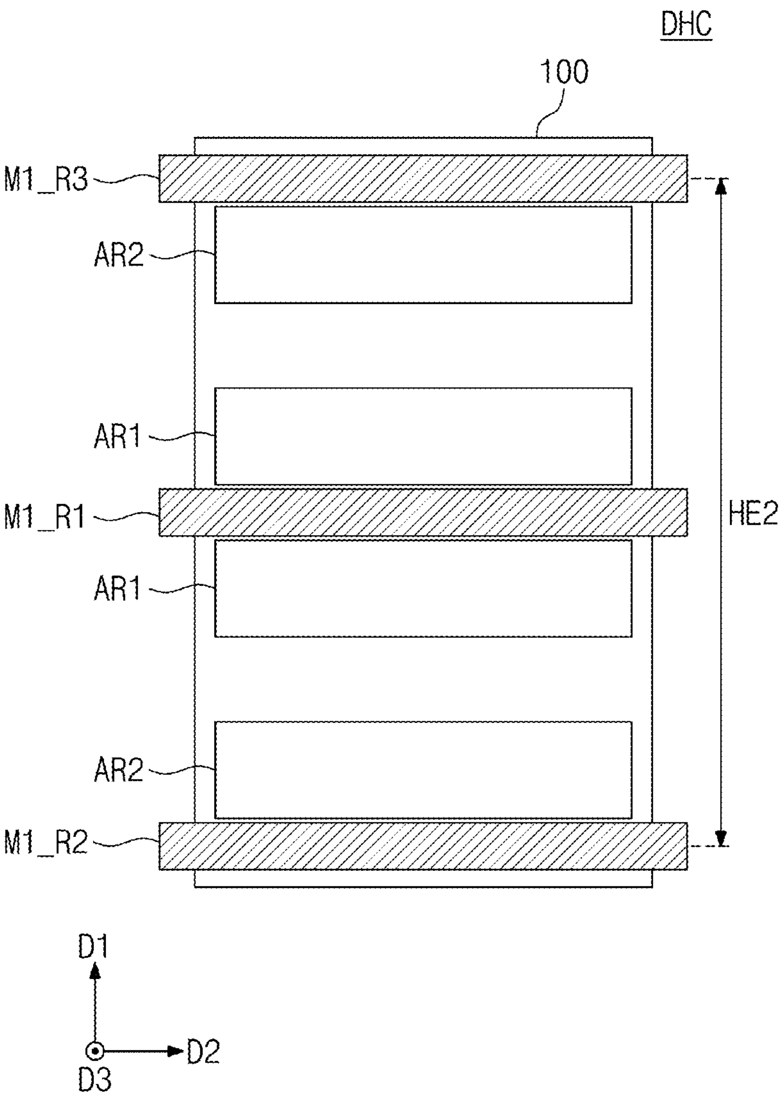
Figure 3:
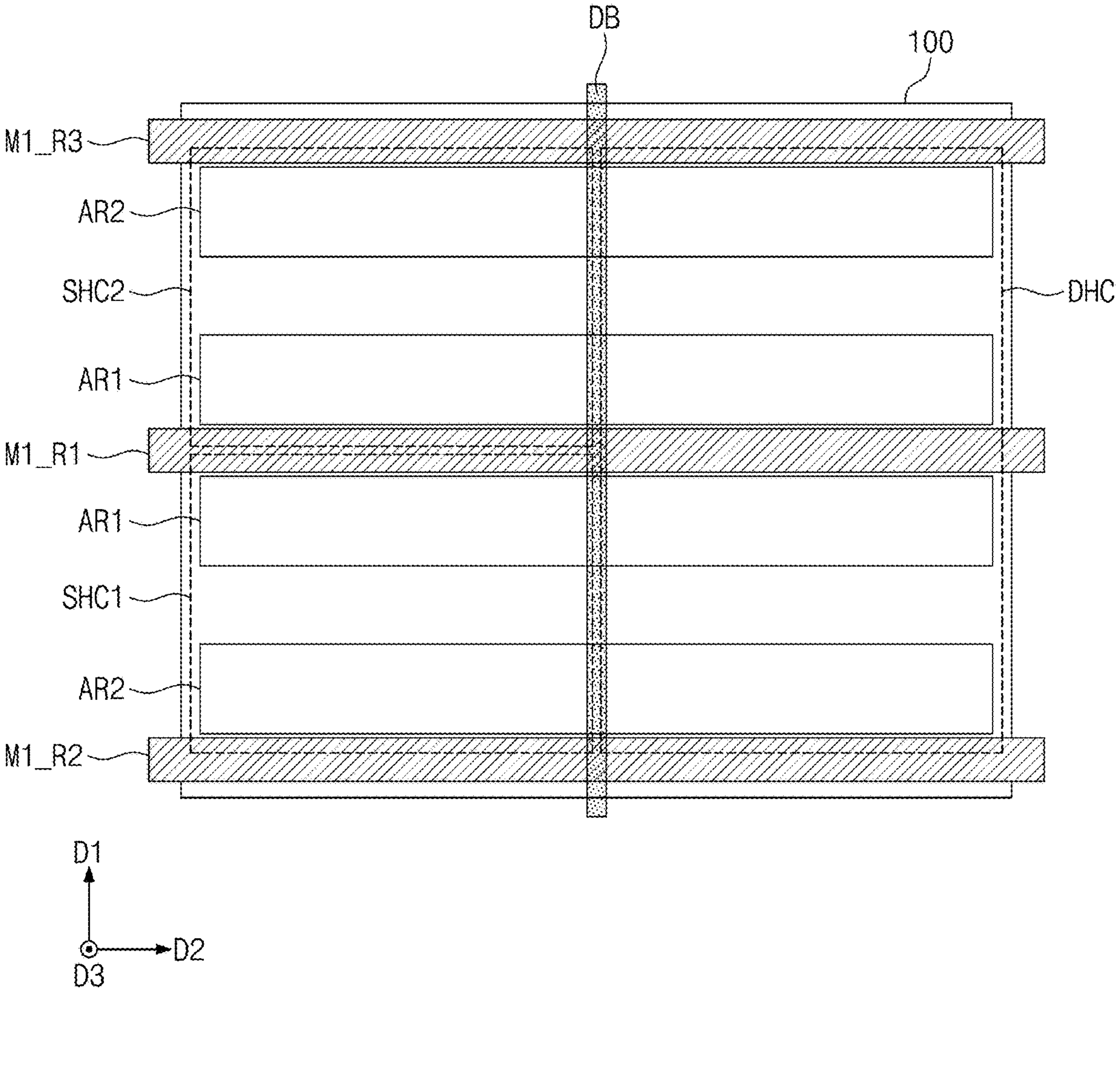

FIGS. 1 to 3 are conceptual views illustrating logic cells of a semiconductor device according to some example embodiments of the inventive concepts.

Referring to FIG. 1, a single height cell SHC may be provided. In detail, a first power wiring M1_R1 and a second power wiring M1_R2 may be provided on a substrate 100. The first power wiring M1_R1 may be a path through which a source voltage VSS, for example, a ground voltage is provided. The second power wiring M1_R2 may be a path through which a drain voltage VDD, for example, a power voltage is provided.

The single height cell SHC may be defined between the first power wiring M1_R1 and the second power wiring M1_R2. The single height cell SHC may include one first active region AR1 and one second active region AR2. One of the first and second active regions AR1 and AR2 may be a PMOSPET region, and the other of the first and second active regions AR1 and AR2 may be an NMOSFET region. That is, the single height cell SHC may have a CMOS structure provided between the first power wiring M1_R1 and the second power wiring M1_R2.

Each of (or alternatively, at least one of) the first and second active regions AR1 and AR2 may have a first width WI1 in a first direction D1. A length of the single height cell SHC in the first direction D1 may be defined as a first height HE1. The first height HE1 may be substantially equal to a distance (e.g., a pitch) between the first power wiring M1_R1 and the second power wiring M1_R2.

The single height cell SHC may constitute one logic cell. Herein, a logic cell may mean a logic element (e.g., AND, OR, XOR, XNOR, inverter, etc.) that performs a specific function. That is, the logic cell may include transistors constituting a logic element and wirings connecting the transistors to each other.

Referring to FIG. 2, a double height cell DHC may be provided. In detail, a first power wiring M1_R1, a second power wiring M1_R2, and a third power wiring M1_R3 may be provided on a substrate 100. The first power wiring M1_R1 may be disposed between the second power wiring M1_R2 and the third power wiring M1_R3. The third power wiring M1_R3 may be a path through which a source voltage VSS is provided.

The double height cell DHC may be defined between the second power wiring M1_R2 and the third power wiring M1_R3. The double height cell DHC may include two first active regions AR1 and two second active regions AR2.

One of the two second active regions AR2 may be adjacent to the second power wiring M1_R2. The other of the two second active regions AR2 may be adjacent to the third power wiring M1_R3. The two first active regions AR1 may be adjacent to the first power wiring M1_R1. On a plane view, the first power wiring M1_R1 may be disposed between the two first active regions AR1.

A length of the double height cell DHC in a first direction D1 may be defined as a second height HE2. The second height HE2 may be about twice the first height HE1 of FIG. 1. The two first active regions AR1 of the double height cell DHC may be grouped to operate as one active region.

In the inventive concepts, the double height cell DHC shown in FIG. 2 may be defined as a multi-height cell. Although not shown, the multi-height cell may include a triple-height cell whose cell height is about three times that of a single height cell SHC.

Referring to FIG. 3, a first single height cell SHC1, a second single height cell SHC2, and a double height cell DHC may be two-dimensionally disposed on a substrate 100. The first single height cell SHC1 may be disposed between first and second power wirings M1_R1 and M1_R2. The second single height cell SHC2 may be disposed between first and third power wirings M1_R1 and M1_R3. The second single height cell SHC2 may be adjacent to the first single height cell SHC1 in a first direction D1.

The double height cell DHC may be disposed between the second and third power wirings M1_R2 and M1_R3. The double height cell DHC may be adjacent to the first and second single height cells SHC1 and SHC2 in a second direction D2.

A separation structure DB may be provided between the first single height cell SHC1 and the double height cell DHC and between the second single height cell SHC2 and the double height cell DHC. An active region of the double height cell DHC may be electrically separated from an active region of each of (or alternatively, at least one of) the first and second single height cells SHC1 and SHC2 by the separation structure DB.

Figure 4:
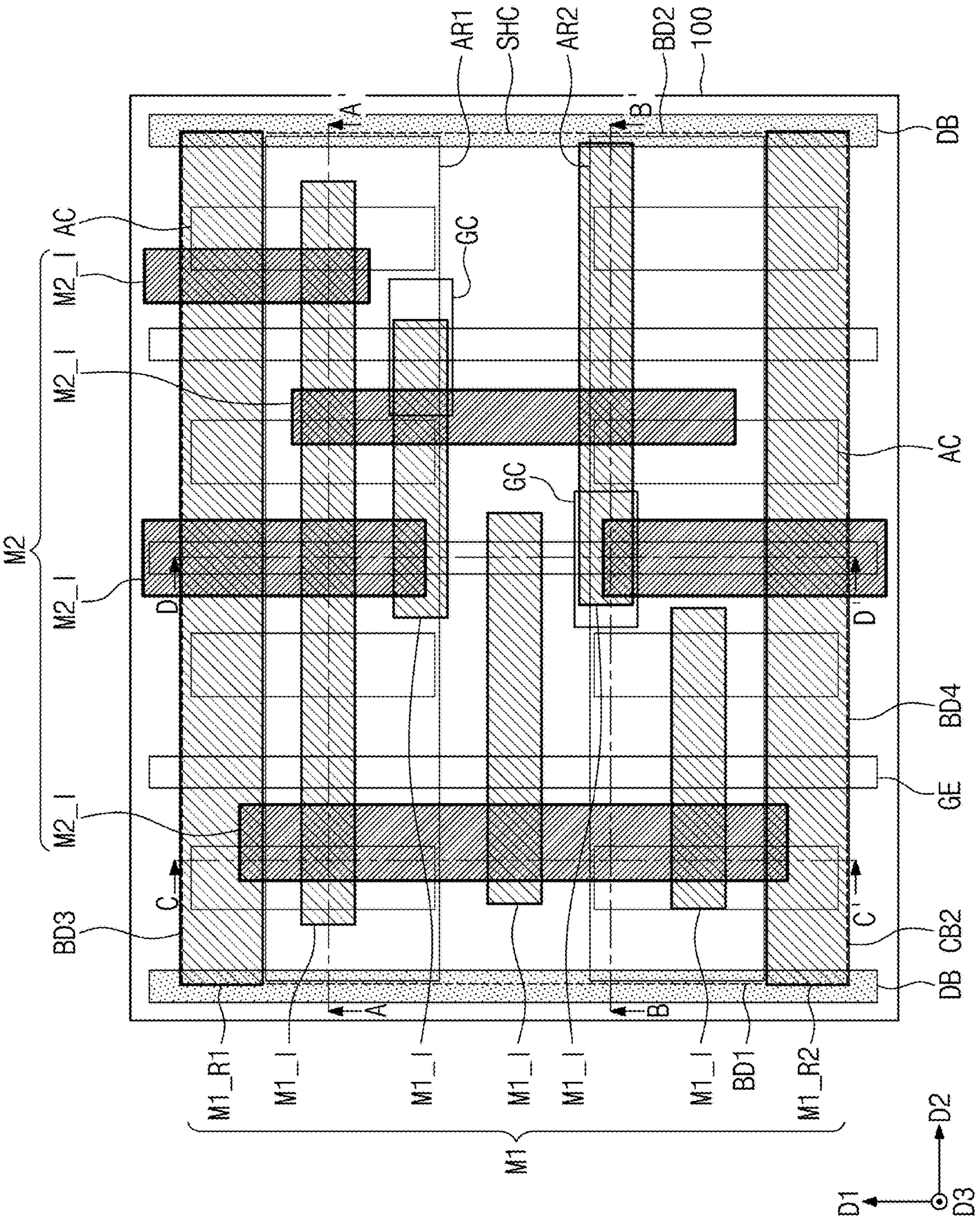
FIG. 4 is a plan view illustrating a semiconductor device according to some example embodiments of the inventive concepts.
Figure 5A:
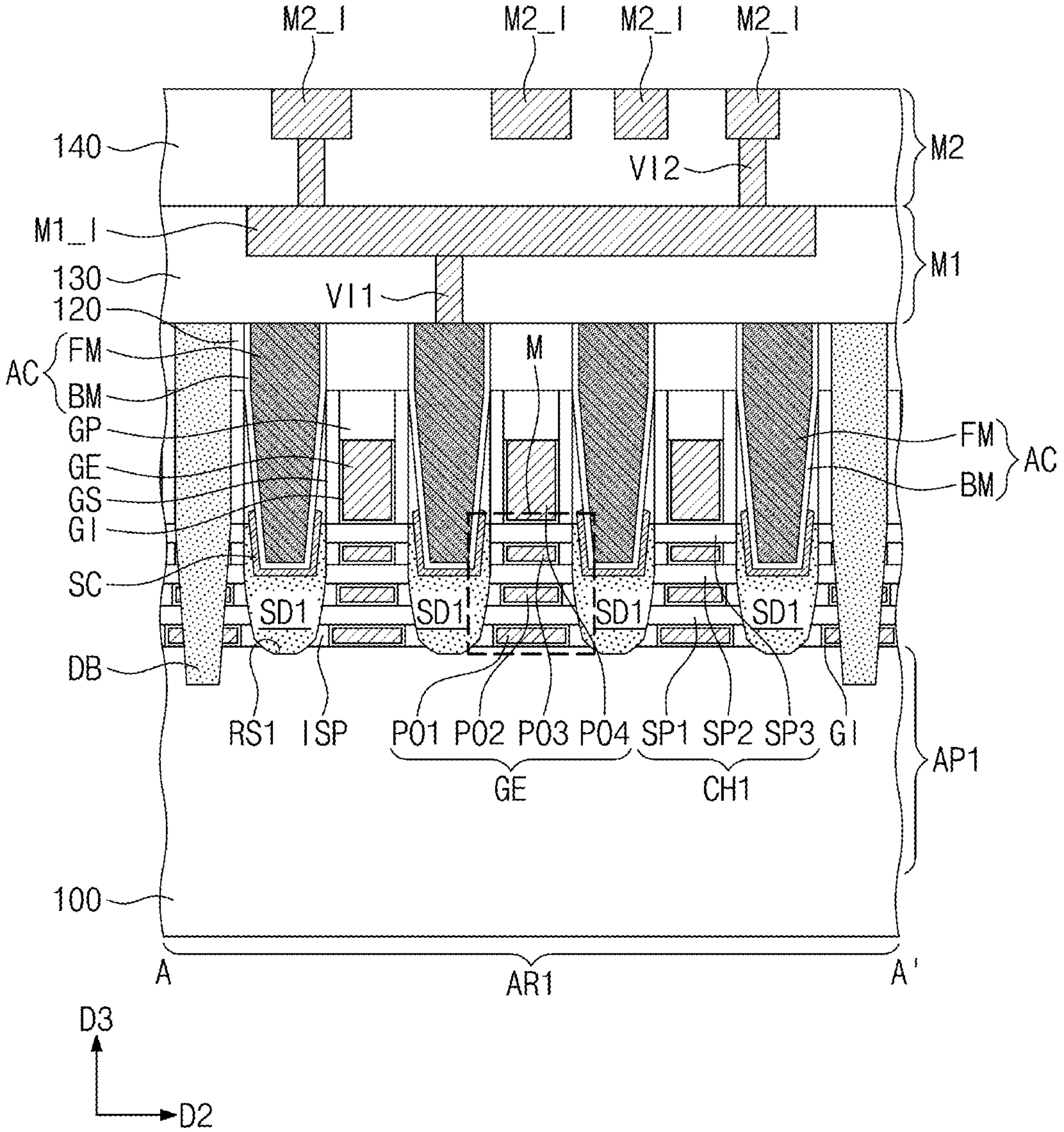
FIGS. 5A to 5D are cross-sectional views taken along lines A-A', B-B', C-C' and D-D' of FIG. 4, respectively.
Figure 5B:
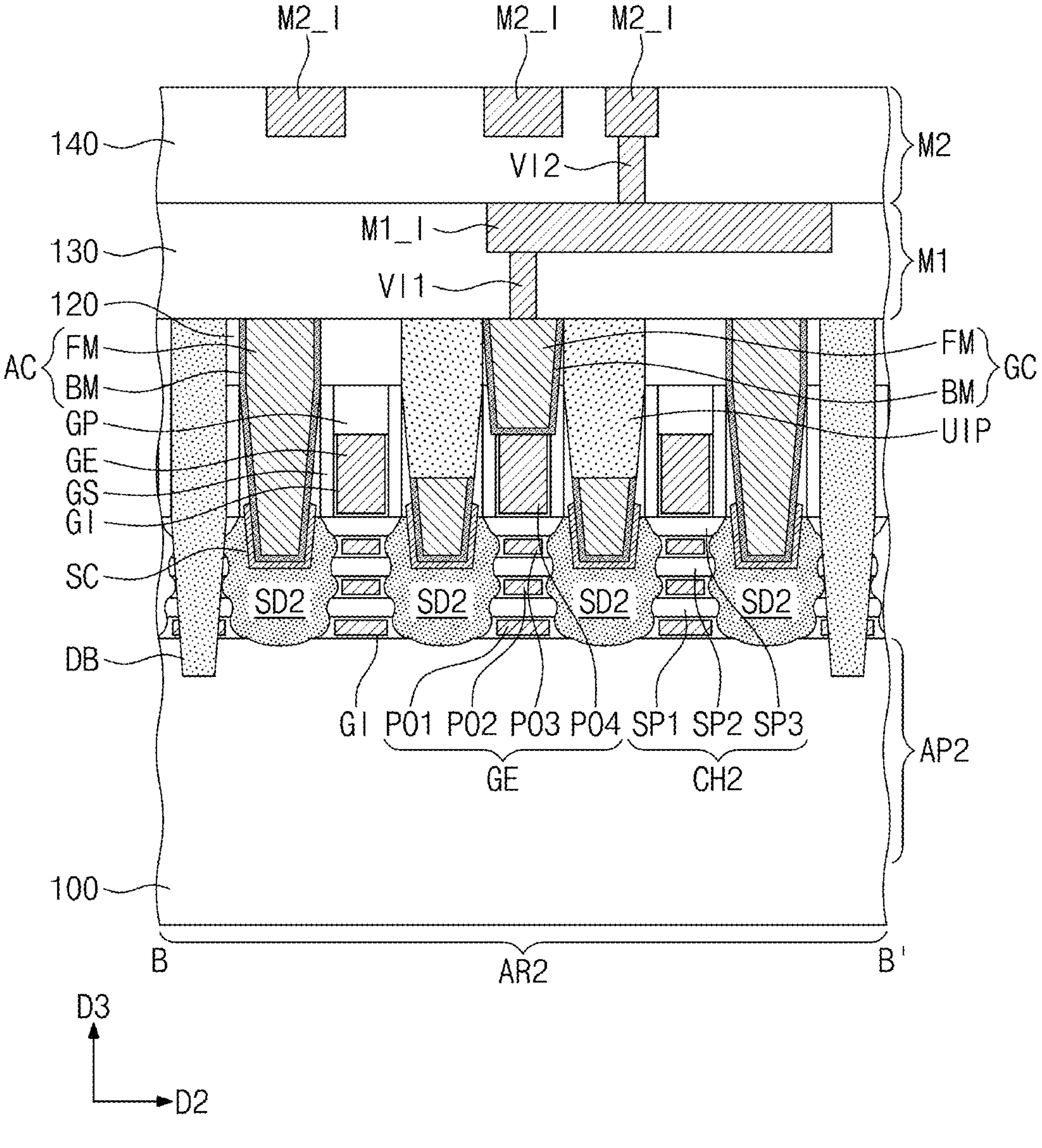
Figure 5C:
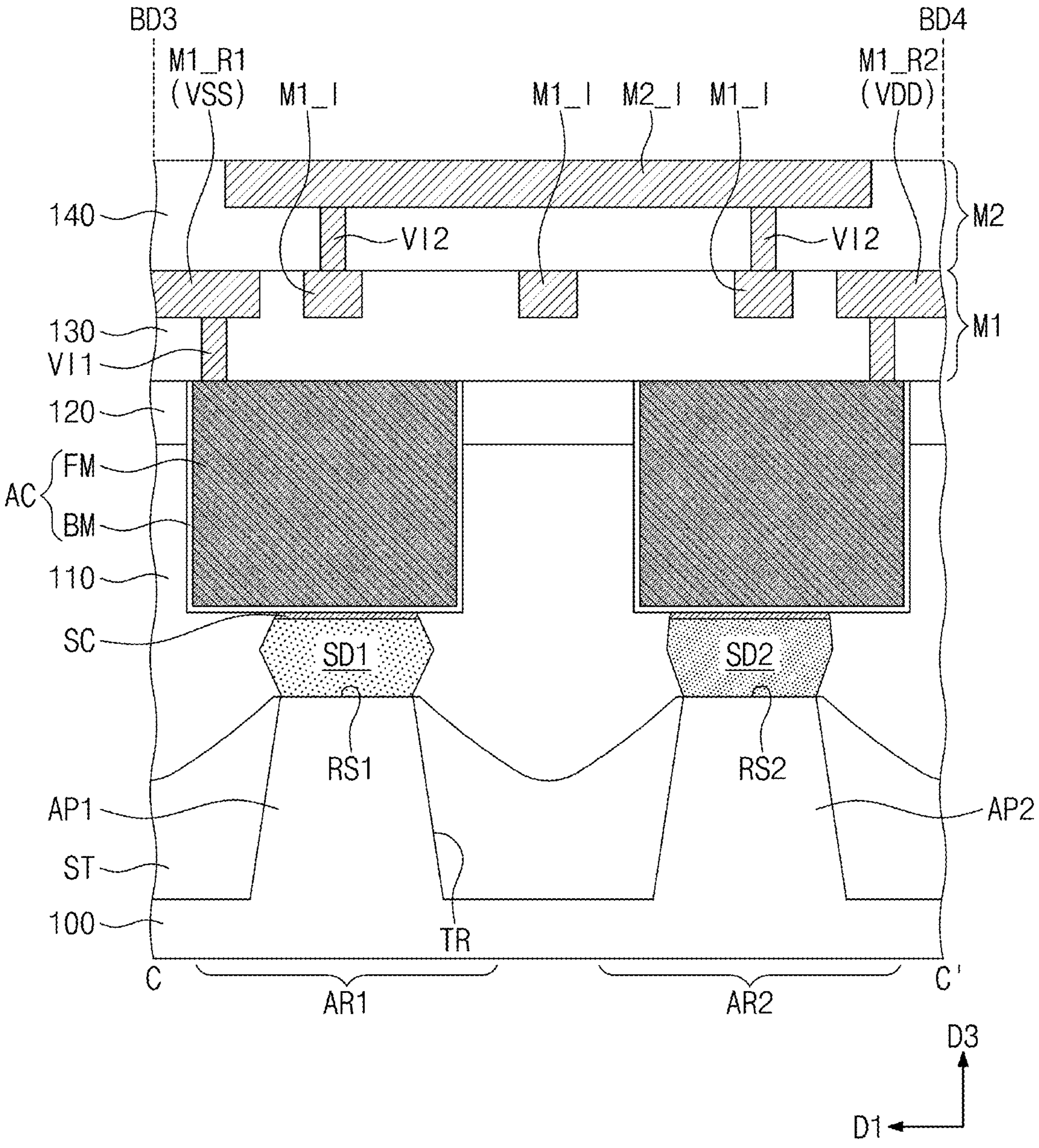

FIG. 4 is a plan view illustrating a semiconductor device according to some example embodiments of the inventive concepts. FIGS. 5A to 5D are cross-sectional views taken along lines A-A', B-B', C-C' and D-D' of FIG. 4, respectively. FIG. 6 is an enlarged view illustrating some example embodiments of region "M" of FIG. 5A. A semiconductor device illustrated in FIGS. 4 and 5A to 5D is an example of the single height cell SHC of FIG. 1 in detail.

Referring to FIGS. 4 and 5A to 5D, a single height cell SHC may be provided on a substrate 100. Logic transistors constituting a logic circuit may be disposed on the single height cell SHC. The substrate 100 may be a semiconductor substrate including silicon, germanium, silicon-germanium, or the like, or a compound semiconductor substrate. For example, the substrate 100 may be a silicon substrate.

The substrate 100 may include a first active region AR1 and a second active region AR2. Each of (or alternatively, at least one of) the first and second active regions AR1 and AR2 may extend in a second direction D2. In some example embodiments, the first active region AR1 may be an NMOSFET region, and the second active region AR2 may be a PMOSFET region.

A first active pattern AP1 and a second active pattern AP2 may be defined by a trench TR formed on the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be portions of the substrate 100 and may be vertically protruding portions.

A device isolation layer ST may be provided on the substrate 100. The device isolation layer ST may fill the trench TR. The device isolation layer ST may include a silicon oxide layer. The device isolation layer ST may not cover first and second channel patterns CH1 and CH2, which will be described later.

A first channel pattern CH1 may be provided on the first active pattern AP1. A second channel pattern CH2 may be provided on the second active pattern AP2. Each of (or alternatively, at least one of) the first channel pattern CH1 and the second channel pattern CH2 may include a first semiconductor pattern SP1, a second semiconductor pattern SP2, and a third semiconductor pattern SP3 sequentially stacked. The first to third semiconductor patterns SP1, SP2, and SP3 may be spaced apart from each other in a vertical direction (i.e., a third direction D3).

Each of (or alternatively, at least one of) the first to third semiconductor patterns SP1, SP2, and SP3 may include silicon (Si), germanium (Ge), or silicon-germanium (SiGe). For example, each of (or alternatively, at least one of) the first to third semiconductor patterns SP1, SP2, and SP3 may include crystalline silicon, more specifically, single crystal silicon. In some example embodiments of the inventive concepts, the first to third semiconductor patterns SP1, SP2, and SP3 may be stacked nanosheets. A more detailed description of the first to third semiconductor patterns SP1, SP2, and SP3 according to the inventive concepts will be described later with reference to FIG. 6.

A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first source/drain patterns SD1 may be impurity regions of a first conductivity type (e.g., n-type). A first channel pattern CH1 may be interposed between a pair of first source/drain patterns SD1. That is, the stacked first to third semiconductor patterns SP1, SP2, and SP3 may connect the pair of first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second source/drain patterns SD2 may be impurity regions of a second conductivity type (e.g., p-type). A second channel pattern CH2 may be interposed between a pair of second source/drain patterns SD2. That is, the stacked first to third semiconductor patterns SP1, SP2, and SP3 may connect the pair of second source/drain patterns SD2 to each other.

The first and second source/drain patterns SD1 and SD2 may be epitaxial patterns formed by a selective epitaxial growth (SEG) process. For example, a top surface of each of (or alternatively, at least one of) the first and second source/drain patterns SD1 and SD2 may be higher than a top surface of the third semiconductor pattern SP3. As another example, a top surface of at least one of the first and second source/drain patterns SD1 and SD2 may be positioned at substantially the same level as a top surface of the third semiconductor pattern SP3.

In some example embodiments of the inventive concepts, the first source/drain patterns SD1 may include the same semiconductor element (e.g., Si) as the substrate 100. The second source/drain patterns SD2 may include a semiconductor element (e.g., SiGe) having a lattice constant greater than a lattice constant of a semiconductor element (e.g., Si) of the substrate 100. Accordingly, the pair of second source/drain patterns SD2 may provide a compressive stress to the second channel pattern CH2 therebetween.

In some example embodiment of the inventive concepts, a sidewall of the second source/drain pattern SD2 may have a rough embossing shape. That is, the sidewall of the second source/drain pattern SD2 may have a wavy profile. The sidewall of the second source/drain pattern SD2 may protrude toward first to third portions PO1, PO2, and PO3 of a gate electrode GE to be described later.

Gate electrodes GE may be provided on the first and second channel patterns CH1 and CH2. Each of (or alternatively, at least one of) the gate electrodes GE may cross the first and second channel patterns CH1 and CH2 and may extend in a first direction D1. Each of (or alternatively, at least one of) the gate electrodes GE may vertically overlap the first and second channel patterns CH1 and CH2. The gate electrodes GE may be arranged in the second direction D2 by a first pitch.

The gate electrode GE may include a first portion PO1 interposed between the first semiconductor patterns SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Figure 5D:
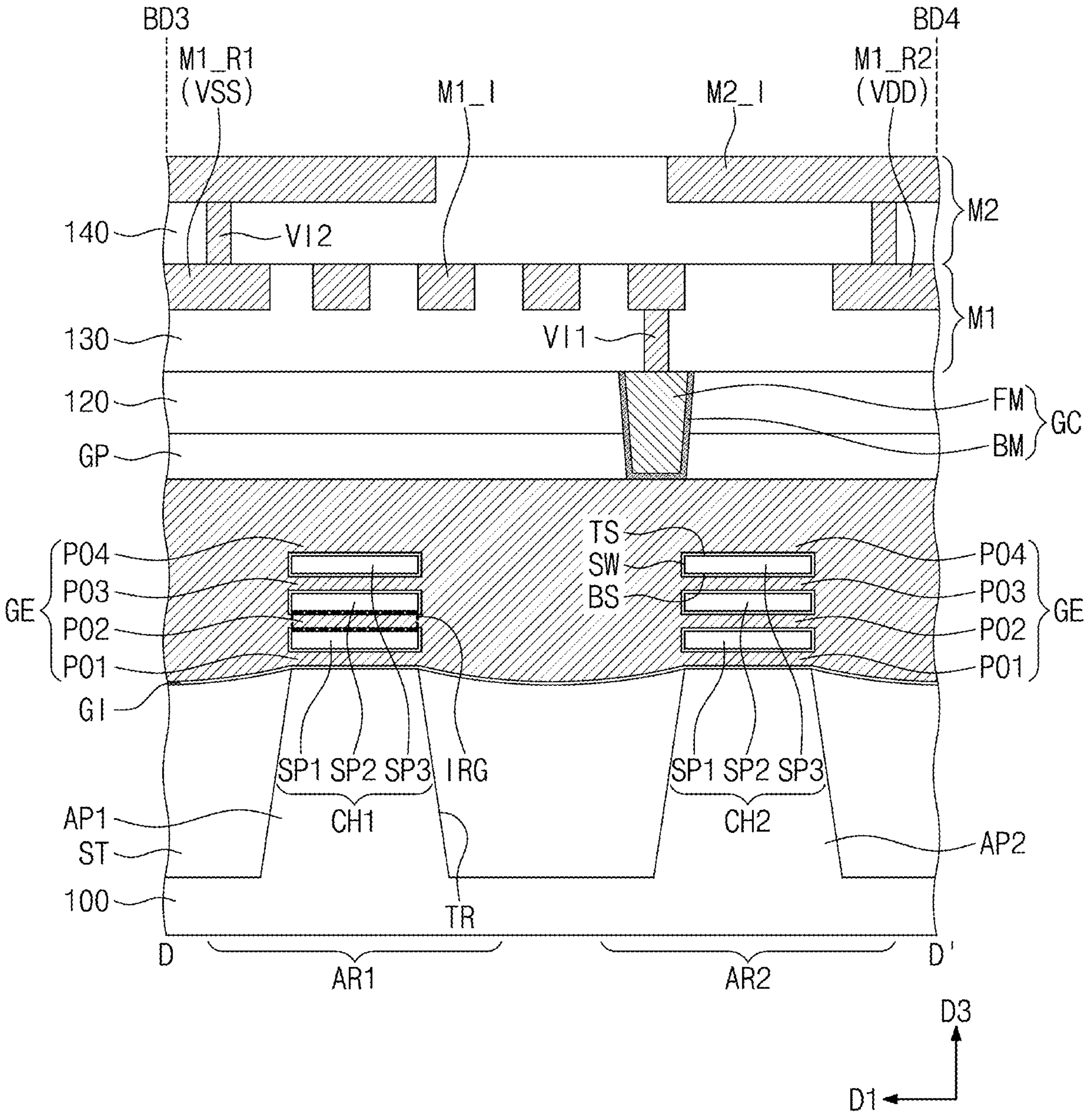
Figure 6:
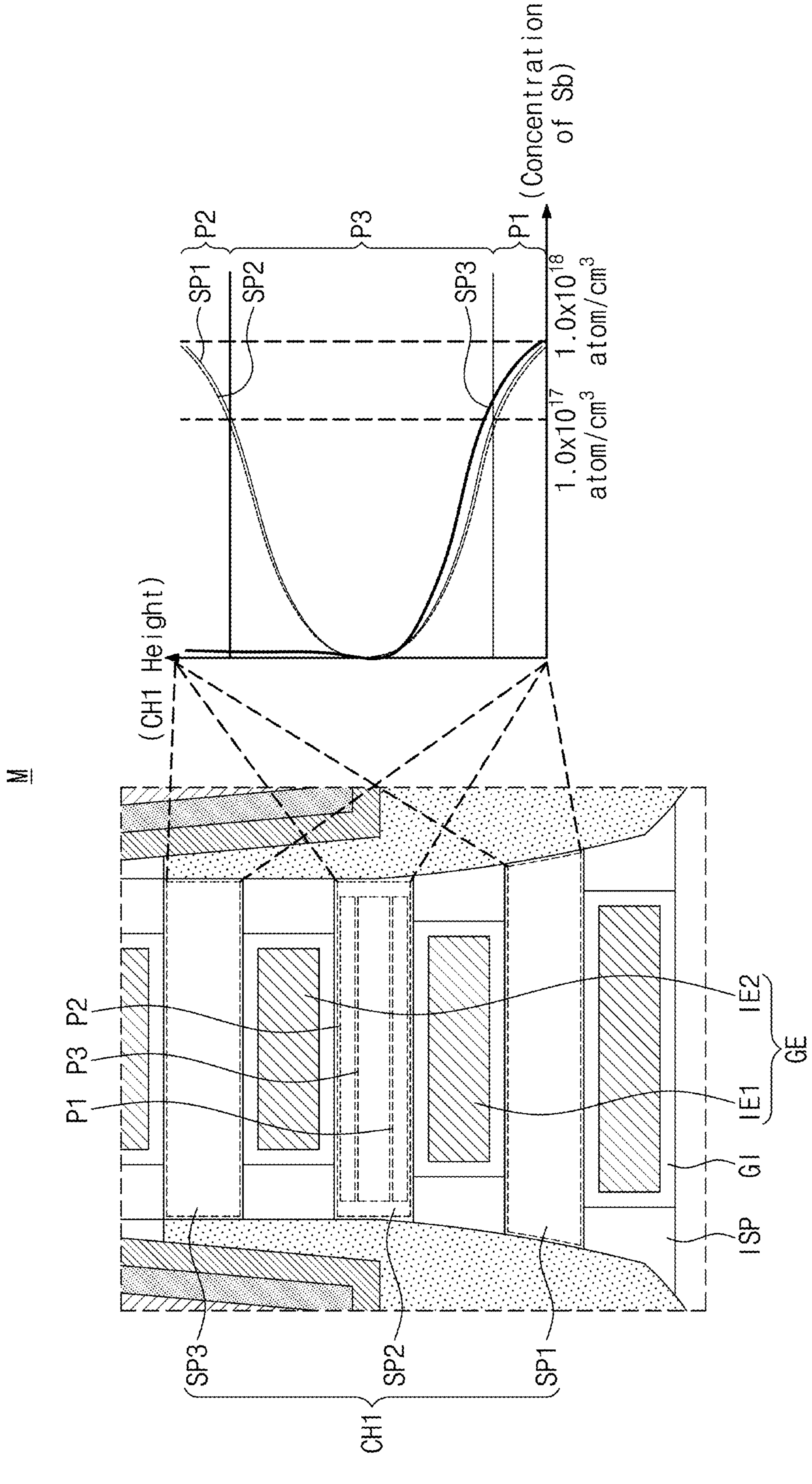
FIG. 6 is an enlarged view illustrating some example embodiments of region "M" of FIG. 5A.

Referring to FIG. 5D, the gate electrode GE may be provided on a top surface TS, a bottom surface BS, and both sidewalls SW of each of (or alternatively, at least one of) the first to third semiconductor patterns SP1, SP2, and SP3. That is, the transistor according to some example embodiments may be a three-dimensional field effect transistor (e.g., MBCFET or GAAFET) in which the gate electrode GE surrounds the channel, three-dimensionally.

On the first active region AR1, inner spacers ISP may be interposed between the first to third portions PO1, PO2, and PO3 of the gate electrode GE and the first source/drain pattern SD1, respectively. Each of (or alternatively, at least one of) the first to third portions PO1, PO2, and PO3 of the gate electrode GE may be spaced apart from the first source/drain pattern SD1 with the inner spacer ISP interposed therebetween. The inner spacer ISP may prevent or hinder leakage current from the gate electrode GE.

Referring back to FIGS. 4 and 5A to 5D, a pair of gate spacers GS may be respectively disposed on both sidewalls of the fourth portion PO4 of the gate electrode GE. The gate spacers GS may extend in the first direction D1 along the gate electrode GE. Top surfaces of the gate spacers GS may be higher than a top surface of the gate electrode GE. The top surfaces of the gate spacers GS may be coplanar with a top surface of a first interlayer insulating layer 110 to be described later. In some example embodiments, the gate spacers GS may include at least one of SiCN, SiCON, and SiN. In another example embodiment, the gate spacers GS may include a multi-layer formed of or include at least two of SiCN, SiCON, and SiN. In some example embodiments of the inventive concepts, the gate spacer GS may include an insulating material containing Si. The gate spacer GS may function as an etch stop layer when forming active contacts AC, which will be described later. The active contacts AC may be formed in self-alignment by the gate spacer GS.

Referring back to FIGS. 4 and 5A to 5D, a gate capping pattern GP may be provided on the gate electrode GE. The gate capping pattern GP may extend in the first direction D1 along the gate electrode GE. The gate capping pattern GP may include a material having etch selectivity with respect to first and second interlayer insulating layers 110 and 120 to be described later. In detail, the gate capping pattern GP may include at least one of SiON, SiCN, SiCON, and SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and both sidewalls SW of each of (or alternatively, at least one of) the first to third semiconductor patterns SP1, SP2, and SP3. The gate insulating layer GI may cover a top surface of the device isolation layer ST under the gate electrode GE.

In some example embodiments of the inventive concepts, the gate insulating layer GI may include a silicon oxide layer, a silicon oxynitride layer, and/or a high dielectric layer. For example, the gate insulating layer GI may have a structure in which a silicon oxide layer and a high dielectric layer are stacked. The high-k layer may include a high-k material having a higher dielectric constant than a dielectric constant of the silicon oxide layer. For example, the high-k material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In another example embodiment, the semiconductor device of the inventive concepts may include a negative capacitance (NC) FET using a negative capacitor. For example, the gate insulating layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and a capacitance of each capacitor has a positive value, a total capacitance is decreased than a capacitance of each individual capacitor. On the other hand, when at least one of capacitances of two or more capacitors connected in series has a negative value, a total capacitance may have a positive value and be greater than an absolute value of each individual capacitance.

When the ferroelectric material layer having a negative capacitance and the paraelectric material layer having a positive capacitance are connected in series, a total capacitance of the serially connected ferroelectric material layer and the paraelectric material layer may increase. By using the increase in the overall capacitance value, the transistor including the ferroelectric material layer may have a subthreshold swing (SS) of less than 60 mV/decade at room temperature.

The ferroelectric material layer may have ferroelectric properties. The ferroelectric material layer may be, for example, at least one of hafnium oxide, hafnium zirconium oxide, barium strontium titanium oxide, barium titanium oxide, and lead zirconium oxide. Here, for example, hafnium zirconium oxide may be a material in which hafnium oxide is doped with zirconium (Zr). As another example, hafnium zirconium oxide may be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce)), dysprosium (Dy), erbium (Er), gadolinium (Gd), germanium (Ge), scandium (Sc), strontium (Sr), and tin (Sn). Depending on which ferroelectric material the ferroelectric material layer includes, a type of the dopant included in the ferroelectric material layer may vary.

When the ferroelectric material layer includes hafnium oxide, a dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 at % (atomic %) of aluminum. Here, a ratio of the dopant may be a ratio of aluminum to the sum of hafnium and aluminum.

When the dopant is silicon (Si), the ferroelectric material layer may include 2 to 10 at % silicon. When the dopant is yttrium (Y), the ferroelectric material layer may include 2 to 10 at % yttrium. When the dopant is gadolinium (Gd), the ferroelectric material layer may contain 1 to 7 at % gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide and a metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, a crystal structure of hafnium oxide included in the ferroelectric material layer is different from a crystal structure of hafnium oxide included in the paraelectric material layer.

The ferroelectric material layer may have a thickness having ferroelectric properties. The thickness of the ferroelectric material layer may be, for example, 0.5 to 10 nm, but is not limited thereto. A critical thickness representing the ferroelectric properties may vary for each ferroelectric material, and thus the thickness of the ferroelectric material layer may vary depending on the ferroelectric material.

For example, the gate insulating layer GI may include one ferroelectric material layer. As another example, the gate insulating layer GI may include a plurality of ferroelectric material layers spaced apart from each other. The gate insulating layer GI may have a stacked structure in which a plurality of ferroelectric material layers and a plurality of paraelectric material layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal that adjusts a threshold voltage of the transistor. A desired threshold voltage of the transistor may be achieved by adjusting thickness and composition of the first metal pattern. For example, the first to third portions PO1, PO2, and PO3 of the gate electrode GE may be formed of the first metal pattern that is the work function metal.

The first metal pattern may include a metal nitride layer. For example, the first metal pattern may include nitrogen (N) and at least one metal selected from the group consisting of titanium (Ti), tantalum (Ta), aluminum (Al), tungsten (W), and molybdenum (Mo). Restated the first metal pattern may include nitrogen (N) and at least one of titanium (Ti), tantalum (Ta), aluminum (Al), tungsten (W), and molybdenum (Mo). Furthermore, the first metal pattern may further include carbon (C). The first metal pattern may include a plurality of stacked work function metal layers.

The second metal pattern may include a metal having a lower resistance than a resistance of the first metal pattern. For example, the second metal pattern may include at least one metal selected from the group consisting of tungsten (W), aluminum (Al), titanium (Ti), and tantalum (Ta). Restated the second metal pattern may include at least one of tungsten (W), aluminum (Al), titanium (Ti), and tantalum (Ta). For example, the fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with a top surface of the gate capping pattern GP and a top surface of the gate spacer GS. A second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, the first to fourth interlayer insulating layers 110 to 140 may include a silicon oxide layer.

The single height cell SHC may have a first boundary BD1 and a second boundary BD2 facing each other in the second direction D2. The first and second boundaries BD1 and BD2 may extend in the first direction D1. The single height cell SHC may have a third boundary BD3 and a fourth boundary BD4 facing each other in the first direction D1. The third and fourth boundaries BD3 and BD4 may extend in the second direction D2.

A pair of separation structures DB facing each other in the second direction D2 may be provided on both sides of the single height cell SHC. For example, the pair of separation structures DB may be provided on the first and second boundaries BD1 and BD2 of the single height cell SHC, respectively. The separation structure DB may extend parallel to the gate electrodes GE in the first direction D1. A pitch between the separation structure DB and the gate electrode GE adjacent thereto may be the same as the first pitch.

The separation structure DB may extend into the first and second active patterns AP1 and AP2 through the first and second interlayer insulating layers 110 and 120. The separation structure DB may pass through each of (or alternatively, at least one of) the first and second active patterns AP1 and AP2. The separation structure DB may electrically isolate an active region of the single height cell SHC from an active region of another adjacent cell.

Active contacts AC may be provided through the first and second interlayer insulating layers 110 and 120 to be electrically connected to the first and second source/drain patterns SD1 and SD2, respectively. A pair of active contacts AC may be provided on both sides of the gate electrode GE, respectively. On a plane view, the active contact AC may have a bar shape extending in the first direction D1.

The active contact AC may be a self-aligned contact. That is, the active contact AC may be formed in a self-aligned manner using the gate capping pattern GP and the gate spacer GS. For example, the active contact AC may cover at least a portion of a sidewall of the gate spacer GS. Although not shown, the active contact AC may partially cover the top surface of the gate capping pattern GP.

A metal-semiconductor compound layer SC, for example, a silicide layer, may be interposed between the active contact AC and the first source/drain pattern SD1 and between the active contact AC and the second source/drain pattern SD2, respectively. The active contact AC may be electrically connected to the source/drain patterns SD1 and SD2 through the metal-semiconductor compound layer SC. For example, the metal-semiconductor compound layer SC may include at least one of titanium-silicide, tantalum-silicide, tungsten-silicide, nickel-silicide, and cobalt-silicide.

Gate contacts GC may be provided through the second interlayer insulating layer 120 and the gate capping pattern GP to be electrically connected to the gate electrodes GE, respectively. On a plane view, the gate contacts GC may be disposed to overlap the first active region AR1 and the second active region AR2, respectively. As an example, the gate contact GC may be provided on the second active pattern AP2 (refer to FIG. 5B).

In some example embodiments of the inventive concepts, referring to FIG. 5B, an upper portion of the active contact AC adjacent to the gate contact GC may be filled with the upper insulating pattern UIP. A bottom surface of the upper insulating pattern UIP may be lower than a bottom surface of the gate contact GC. That is, a top surface of the active contact AC adjacent to the gate contact GC may be lower than the bottom surface of the gate contact GC by the upper insulating pattern UIP. Accordingly, a short circuit where the gate contact GC comes into contact with the active contact AC adjacent thereto may be prevented or hindered.

Each of (or alternatively, at least one of) the active contact AC and the gate contact GC may include a conductive pattern FM and a barrier pattern BM surrounding the conductive pattern FM. For example, the conductive pattern FM may include at least one of aluminum, copper, tungsten, molybdenum, and cobalt. The barrier pattern BM may cover sidewalls and a bottom surface of the conductive pattern FM. The barrier pattern BM may include a metal layer/metal nitride layer. The metal layer may include at least one of titanium, tantalum, tungsten, nickel, cobalt, and platinum. The metal nitride layer may include at least one of a titanium nitride layer (TiN), a tantalum nitride layer (TaN), a tungsten nitride layer (WN), a nickel nitride layer (NiN), a cobalt nitride layer (CoN), and a platinum nitride layer (PtN).

A first metal layer M1 may be provided in the third interlayer insulating layer 130. For example, the first metal layer M1 may include a first power wiring M1_R1, a second power wiring M1_R2, and first wirings M1_I. Each of (or alternatively, at least one of) the wirings M1_R1, M1_R2, and M1_I of the first metal layer M1 may extend parallel to each other in the second direction D2.

In detail, the first and second power wirings M1_R1 and M1_R2 may be provided on the third and fourth boundaries BD3 and BD4 of the single height cell SHC, respectively. The first power wiring M1_R1 may extend in the second direction D2 along the third boundary BD3. The second power wiring M1_R2 may extend in the second direction D2 along the fourth boundary BD4.

The first wirings M1_I of the first metal layer M1 may be disposed between the first and second power wirings M1_R1 and M1_R2. The first wirings M1_I of the first metal layer M1 may be arranged in the first direction D1 at a second pitch. The second pitch may be smaller than the first pitch. A critical dimension of each of (or alternatively, at least one of) the first wirings M1_I may be smaller than a critical dimension of each of (or alternatively, at least one of) the first and second power wirings M1_R1 and M1_R2.

The first metal layer M1 may further include first vias VI1. The first vias VI1 may be respectively provided under the wirings M1_R1, M1_R2, and M1_I of the first metal layer M1. The active contact AC and the wiring of the first metal layer M1 may be electrically connected to each other through the first via VI1 The gate contact GC and the wiring of the first metal layer M1 may be electrically connected to each other through the first via VI1

The wiring of the first metal layer M1 and the first via VI1 below the wiring may be formed through separate processes. That is, each of (or alternatively, at least one of) the wiring and the first via VI1 of the first metal layer M1 may be formed by a single damascene process. The semiconductor device according to some example embodiments may be formed using a process of less than 20 nm.

A second metal layer M2 may be provided in the fourth interlayer insulating layer 140. The second metal layer M2 may include a plurality of second wirings M2_I. Each of (or alternatively, at least one of) the second wirings M2_I of the second metal layer M2 may have a line shape or a bar shape extending in the first direction D1. That is, the second wirings M2_I may extend parallel to each other in the first direction D1.

The second metal layer M2 may further include second vias VI2 respectively provided under the second wirings M2_I. The wiring of the first metal layer M1 and the wiring of the second metal layer M2 may be electrically connected to each other through the second via VI2. For example, the wiring of the second metal layer M2 and the second via VI2 below the wiring may be formed together by a dual damascene process.

The wiring of the first metal layer M1 and the wiring of the second metal layer M2 may include the same or different conductive materials. For example, the wiring of the first metal layer M1 and the wiring of the second metal layer M2 may include at least one metal material selected from aluminum, copper, tungsten, molybdenum, ruthenium, and cobalt. Although not shown, metal layers (e.g., M3, M4, M5 . . . ) stacked on the fourth interlayer insulating layer 140 may be additionally disposed. Each of (or alternatively, at least one of) the stacked metal layers may include wirings for routing between cells.

Referring to FIG. 6, the first to third semiconductor patterns SP1 to SP3 will be described in more detail. The first to third semiconductor patterns SP1 to SP3 may be sequentially provided to be spaced apart from each other in the third direction (D3 of FIG. 5A). Each of (or alternatively, at least one of) the first to third semiconductor patterns SP1 to SP3 may have a width in the second direction (D2 of FIG. 5A). That is, the first semiconductor pattern SP1 may have a first width, the second semiconductor pattern SP2 may have a second width, and the third semiconductor pattern SP3 may have a third width. The first width may be greater than the second width, and the second width may be greater than the third width. The first to third widths may increase toward a lower portion of the substrate (e.g., the second width is greater than the first width, and the third width is greater than the second width).

The gate electrode GE may be interposed between the adjacent semiconductor patterns SP1 to SP3. The gate electrode GE may vertically overlap the semiconductor patterns SP1 to SP3. The gate insulating layer GI may be interposed between the gate electrode GE and the semiconductor patterns SP1 to SP3. The gate insulating layer GI may cover the top surface, the bottom surface, and both sidewalls of the gate electrode GE.

In detail, the gate electrode GE may include a first inner electrode IE1 and a second inner electrode IE2. The first inner electrode IE1 may correspond to the second portion PO2 of the gate electrode GE of FIG. 5A. The second inner electrode IE2 may correspond to the third portion PO3 of the gate electrode GE of FIG. 5A. The second semiconductor pattern SP2 may be interposed between the first and second inner electrodes IE1 and IE2. The second semiconductor pattern SP2 may include a first portion P1, a second portion P2, and a third portion P3.

The first to third portions P1 to P3 of the second semiconductor pattern SP2 may vertically overlap. The first portion P1 may be provided adjacent to the first inner electrode IE1. The second portion P2 may be provided adjacent to the second inner electrode IE2. The third portion P3 may be provided between the first portion P1 and the second portion P2. That is, the third portion P3 may be disposed on the first portion P1, and the second portion P2 may be disposed on the third portion P3. The first semiconductor pattern SP1 may have a region corresponding to the first to third portions P1 to P3 of the second semiconductor pattern SP2.

According to some example embodiments of the inventive concepts, dopant concentrations of the first and second portions P1 and P2 and the third portion P3 may be different. A dopant concentration of each of (or alternatively, at least one of) the first and second portions P1 and P2 may be greater than a dopant concentration of the third portion P3. The dopant may not exist in the third portion P3. For example, the concentration of each of (or alternatively, at least one of) the dopant in the first and second portions P1 and P2 may be $1.0\times10^{17}$ atoms/cm$^3$ to $1.0\times10^{18}$ atoms/cm$^3$. The dopant concentration of the third portion P3 may converge to zero.

The third portion P3 may include undoped Si. As the undoped silicon is used as a channel, mobility of a carrier that generates a current flow in the semiconductor may be improved. The carrier may be an electron or a hole. As a concentration of the dopant in a sacrificial layer to be described later becomes higher, the amount of the dopant diffused from the sacrificial layer to the active layer may increase. That is, the dopant may diffuse into the active layer or the channel region of the semiconductor patterns SP1 to SP3 depending on a temperature of a subsequent process. As a result, regions including undoped silicon in the semiconductor patterns SP1 to SP3 may be reduced.

Referring back to FIG. 6, as an example, the dopant may be antimony (Sb). As another example, the dopant may be an element having an atomic weight greater than an atomic weight of silicon (Si), and a type of the dopant may not be limited thereto. For example, the dopant may be selected from the group consisting of phosphorous (P), arsenic (As), antimony (Sb), bismuth (Bi), sulfur (S), selenium (Se), tellurium (Te), gallium (Ga), and indium (In). Restated, the dopant may include at least one of phosphorous (P), arsenic (As), antimony (Sb), bismuth (Bi), sulfur (S), selenium (Se), tellurium (Te), gallium (Ga), and indium (In). As an element having an atomic weight greater than an atomic weight of silicon is used as a dopant, an etch rate of dry and wet etching processes for a sacrificial layer, which will be described later, may be improved. That is, it is possible to improve an etching selectivity of the sacrificial layer compared to the active layer. This may be because an interstitial bonding is weakened by doping the sacrificial layer formed of silicon or silicon-germanium with a dopant having an atomic size larger than an atomic size of silicon.

Referring to FIG. 6, a graph may illustrate a concentration of the dopant depending on a height of the first to third semiconductor patterns SP1 to SP3. In the case of the first and second semiconductor patterns SP1 and SP2, as the height increases, the concentration of the dopant (concentration of Sb) may exponentially decrease and then increase. That is, dopant concentration profiles of the first and second semiconductor patterns SP1 and SP2 may have a U-shape. The concentration of the dopant at a point in time when a slope of the concentration profile is rapidly changed may be $1.0\times10^{17}$ atoms/cm$^3$.

In the case of the third semiconductor pattern SP3, the concentration of the dopant may decrease exponentially as the height increases. That is, in a region of the third semiconductor pattern SP3 adjacent to the second inner electrode IE2, a concentration of the dopant may be $1.0\times10^{17}$ atoms/cm$^3$ to $1.0\times10^{18}$ atoms/cm$^3$. The concentration of the dopant may decrease as the third semiconductor pattern SP3 approaches the fourth portion (PO4 of FIG. 5A)

of the gate electrode GE. The dopant concentration of the third semiconductor pattern SP3 adjacent to a lower surface of the fourth portion (PO4 of FIG. 5A) may converge to zero.

FIGS. 7A, 7B, and 8A to 12C are cross-sectional views illustrating a method of manufacturing a semiconductor device according to some example embodiments of the inventive concepts. FIGS. 7C to 7F are cross-sectional views illustrating some example embodiments of a stacked pattern. In detail, FIGS. 7A, 8A, 9A, 10A, 11A, and 12A are cross-sectional views corresponding to line A-A of FIG. 4. FIGS. 9B and 10B are cross-sectional views corresponding to line B-B' of FIG. 4. FIGS. 9C, 10C, 11B, and 12B are cross-sectional views corresponding to line C-C' of FIG. 4. FIGS. 7B, 8B, 11C and 12C are cross-sectional views corresponding to line D-D' of FIG. 4.

Figure 7A:
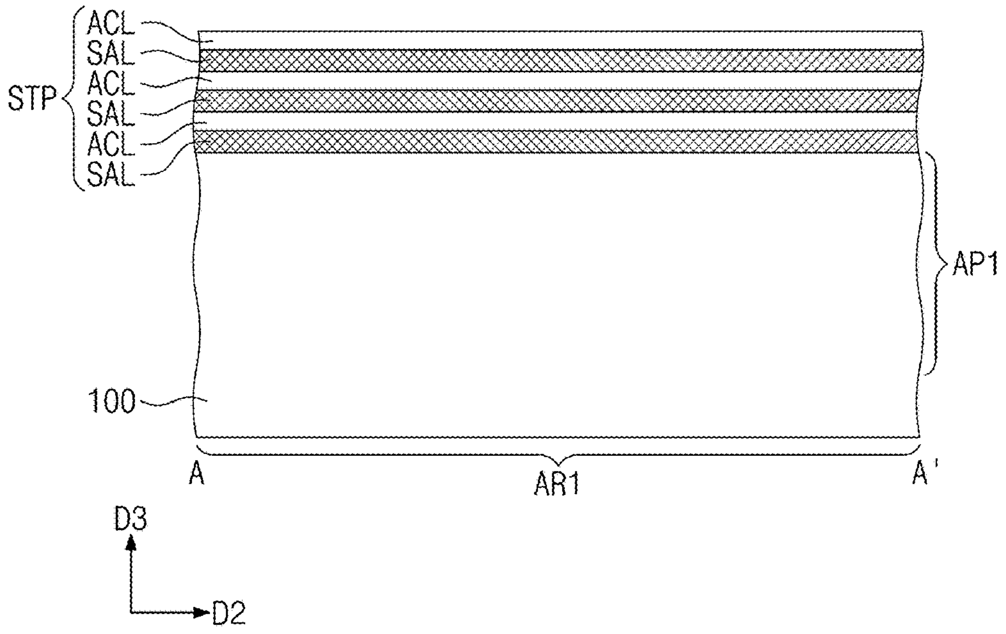
FIGS. 7A, 7B, and 8A to 12C are cross-sectional views illustrating a method of manufacturing a semiconductor device according to some example embodiments of the inventive concepts.
Figure 7B:
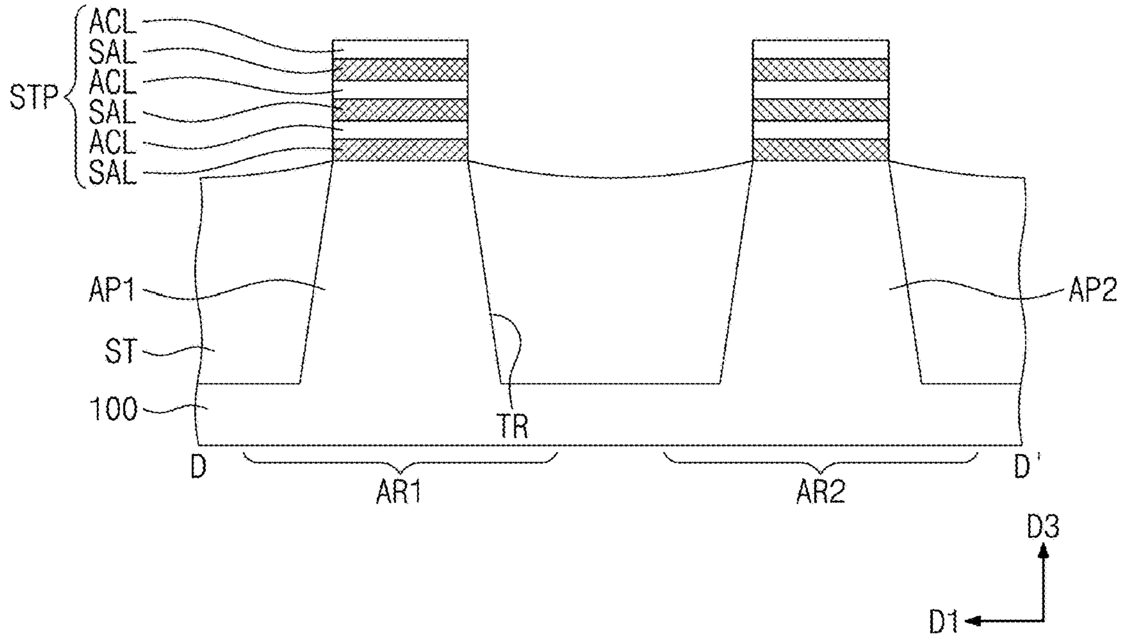

Referring to FIGS. 7A and 7B, a substrate 100 including first and second active regions AR1 and AR2 may be provided. Active layers ACL and sacrificial layers SAL may be alternately stacked on the substrate 100. The active layers ACL may include one of silicon (Si), germanium (Ge), and silicon-germanium (SiGe), and the sacrificial layers SAL may include another one of silicon (Si), germanium (Ge), and silicon-germanium (SiGe). Forming the sacrificial layers SAL may be doping silicon, germanium, and silicon-germanium with a dopant at a dose of $1.0\times10^{19}$ atoms/cm$^2$ to $1.0\times10^{22}$ atoms/cm$^2$.

The sacrificial layer SAL may include a material having an etch selectivity with respect to the active layer ACL. For example, the active layers ACL may include silicon (Si), and the sacrificial layers SAL may include silicon-germanium (SiGe). A concentration of germanium (Ge) in each of (or alternatively, at least one of) the sacrificial layers SAL may be 10 at % to 30 at %.

In detail, the sacrificial layer SAL may be a layer in which silicon (Si) is doped with a dopant at a high concentration. The sacrificial layer SAL may be a layer in which silicon-germanium (SiGe) is doped with a dopant at a high concentration. The high concentration may be defined as $1.0\times10^{19}$ atoms/cm$^3$ to $1.0\times10^{21}$ atoms/cm$^3$. The dopant may be a material having an atomic weight greater than an atomic weight of silicon. For example, the dopant may be selected from the group consisting of P, As, Sb, Bi, S, Se, Te, Ga, and In. Restated the dopant include at least one of P, As, Sb, Bi, S, Se, Te, Ga, and In. A concentration of germanium (Ge) in the sacrificial layer SAL may be 5 at % to 40 at %. A concentration of the dopant in the sacrificial layer SAL may be 1 at % to 5 at %. Typically, the dopant may be antimony (Sb).

As a subsequent process proceeds, the dopant doped in the sacrificial layer SAL may be diffused into the active layer ACL by a process temperature. Referring back to FIG. 6, a diffused dopant may diffuse into first and second portions P1 and P2 of a second semiconductor pattern SP2. A concentration of the diffused dopant may be $1.0\times10^{17}$ atoms/cm$^3$ to $1.0\times10^{18}$ atoms/cm$^3$.

As the sacrificial layer SAL is highly doped with a dopant, etch rates of dry and wet etching processes for the sacrificial layer SAL may be improved. That is, the etching selectivity for the sacrificial layer SAL compared to the active layer ACL may be improved. For example, in a wet etching process using peracetic acid, the etch selectivity of the highly doped sacrificial layer SAL may be 3 to 4 times that of the undoped sacrificial layer. Accordingly, residues generated on the active layer ACL in the process of removing the sacrificial layer SAL may be prevented or hindered. The residue may not remain, and thus a shape of a channel of the semiconductor device may be uniformly formed in a quadrangle. In addition, it is possible to prevent or hinder a phenomenon in which the channel of a nanosheet is not formed due to the residue.

As the sacrificial layer SAL is doped, a concentration of germanium (Ge) may decrease. Accordingly, it is possible to prevent or hinder an epi defect occurring due to a difference in lattice constant during a SEG process. As a result, the method of manufacturing the semiconductor device according to the inventive concepts may improve device reliability and ensure excellent electrical characteristics.

Mask patterns may be respectively formed on the first and second active regions AR1 and AR2 of the substrate 100. The mask pattern may have a line shape or a bar shape extending in a second direction D2.

A trench TR defining a first active pattern AP1 and a second active pattern AP2 may be formed by patterning the mask patterns as an etch mask. The first active pattern AP1 may be formed on the first active region AR1. The second active pattern AP2 may be formed on the second active region AR2.

A stacked pattern STP may be formed on each of (or alternatively, at least one of) the first and second active patterns AP1 and AP2. The stacked pattern STP may include active layers ACL and sacrificial layers SAL that are alternately stacked with each other. The stacked pattern STP may be formed together with the first and second active patterns AP1 and AP2 during the patterning process.

Referring to FIGS. 7C to 7F, a stacked pattern STP having a stack may be formed on each of (or alternatively, at least one of) the first and second active patterns AP1 and AP2. The stacked pattern STP may include at least one stack. The stack may be a structure in which a plurality of sacrificial layers SAL1, SAL2, . . . are vertically overlapped and stacked.

Figure 7C:
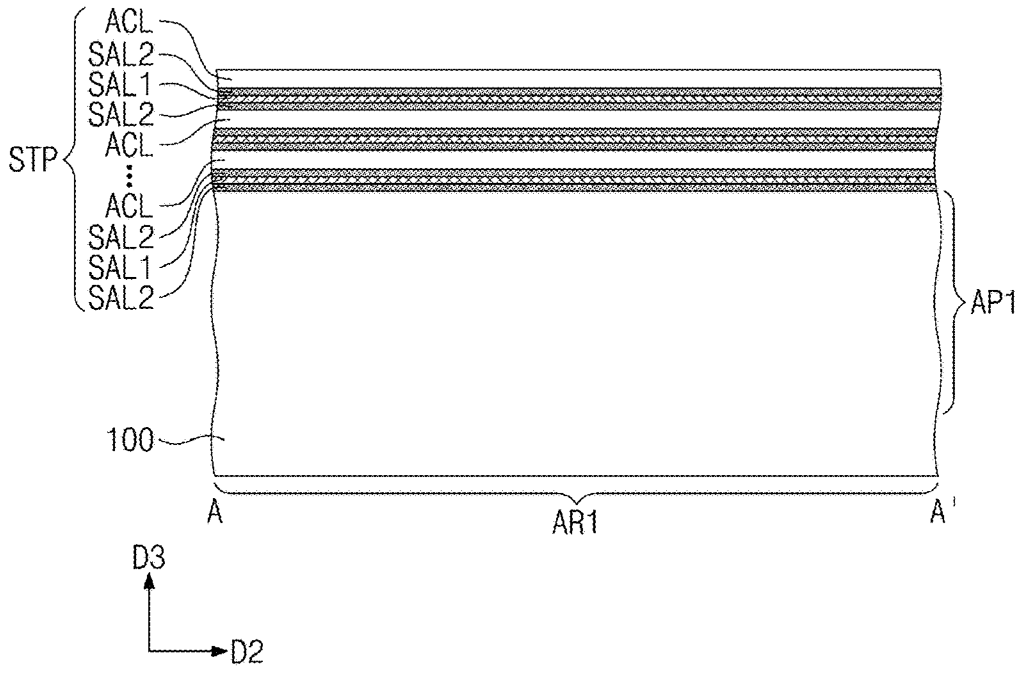
FIGS. 7C to 7F are cross-sectional views illustrating some example embodiments of a stacked pattern.
Figure 7D:
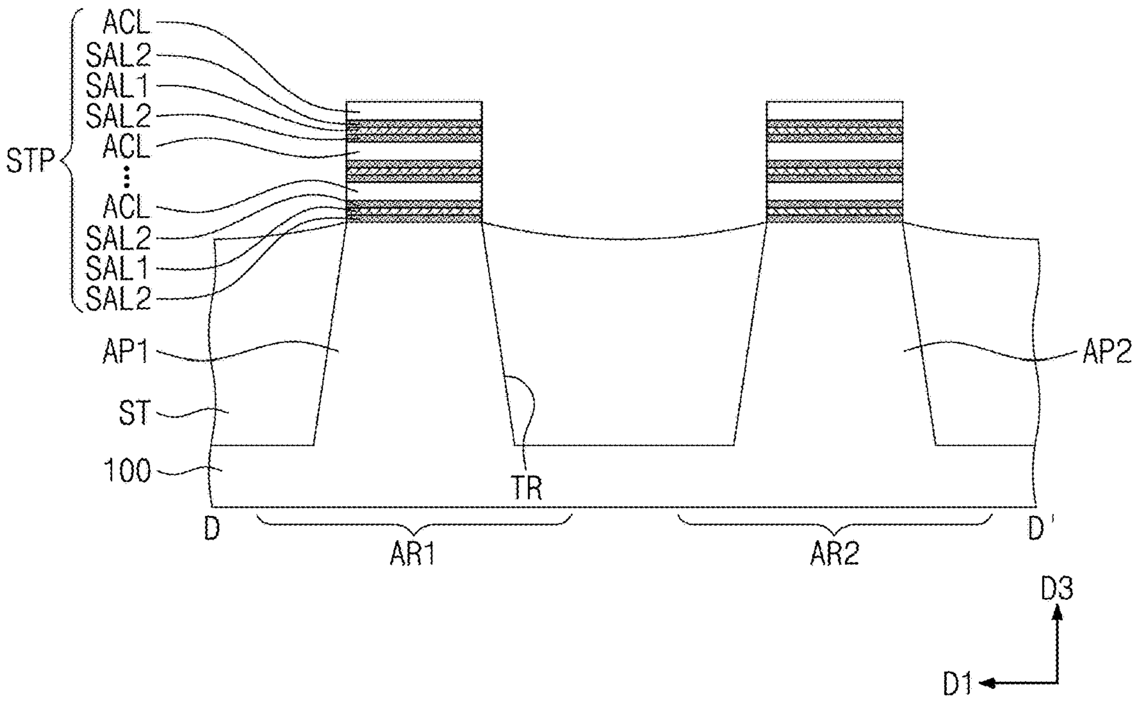

Referring to FIGS. 7C and 7D, the stack may be a structure in which second sacrificial layers SAL2 are provided above and below the first sacrificial layer SAL1. That is, the first sacrificial layer SAL1 may be interposed between the second sacrificial layers SAL2. The first sacrificial layer SAL1 may include a silicon-germanium-dopant layer. For example, the silicon-germanium-dopant layer may be silicon-germanium-antimony (SiGeSb). The second sacrificial layer SAL2 may be formed of silicon-germanium (SiGe). A thickness of the first sacrificial layer SAL1 may be 10% to 30% of a thickness of the stack.

Figure 7E:
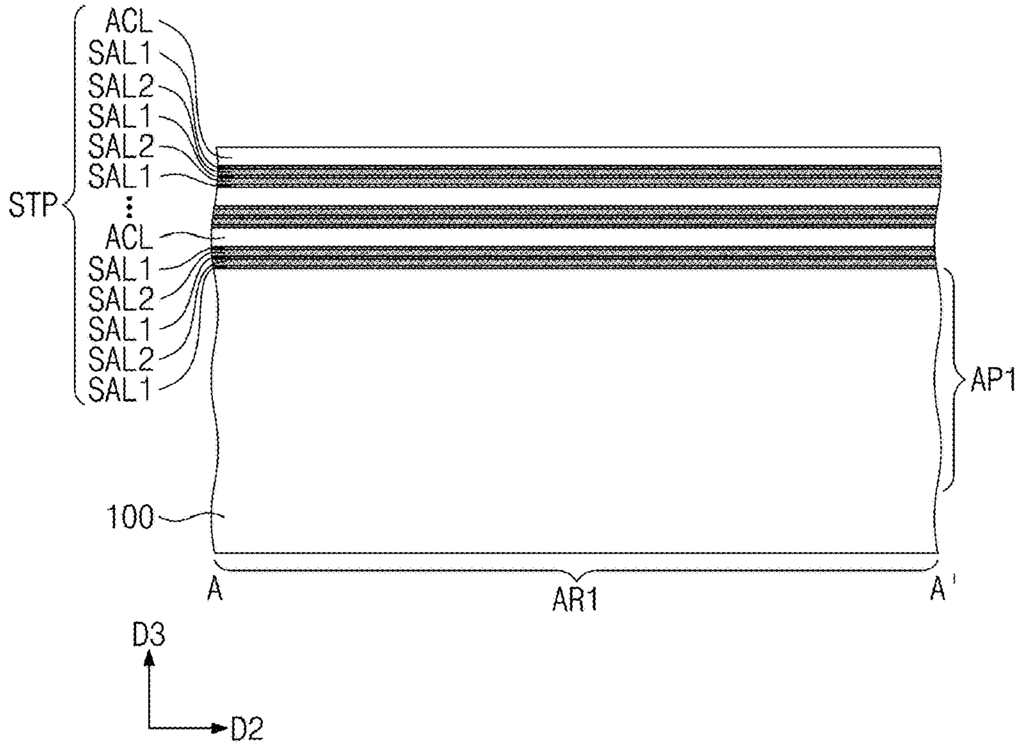
Figure 7F:
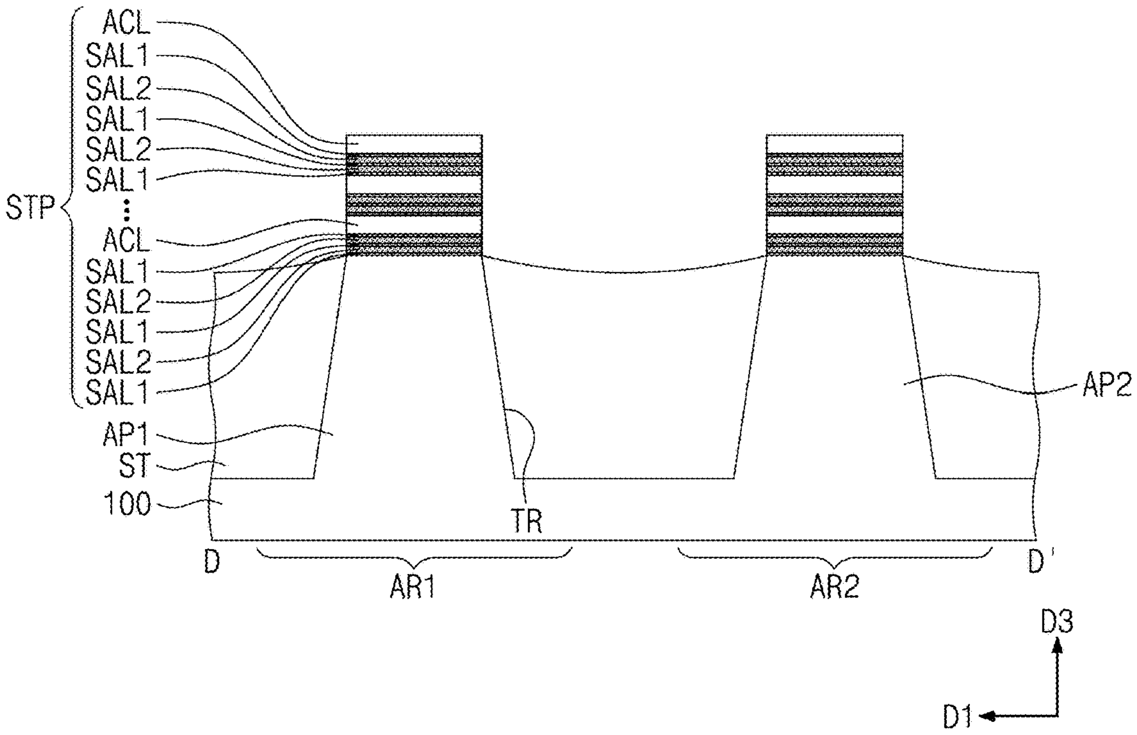

Referring to FIGS. 7E and 7F, a stack may be a structure in which first sacrificial layers SAL1 are provided above and below the second sacrificial layer SAL2. That is, the second sacrificial layer SAL2 may be interposed between the first sacrificial layers SAL1. That is, the stack may include first sacrificial layers SAL1 and second sacrificial layers SAL2 alternately stacked with each other, and the number of layers in the stack may be five. The first sacrificial layer SAL1 may include a silicon-germanium-dopant layer. For example, the silicon-germanium-dopant layer may be silicon-germanium-antimony (SiGeSb). The second sacrificial layer SAL2 may be formed of silicon-germanium (SiGe). A thickness of the first sacrificial layer SAL1 may be 10% to 20% of the thickness of the stack.

A device isolation layer ST filling the trench TR may be formed. In detail, an insulating layer covering the first and second active patterns AP1 and AP2 and the stacked patterns STP may be formed on the entire surface of the substrate 100. The insulating layer may be recessed until the stacked patterns STP are exposed to form the device isolation layer ST.

The device isolation layer ST may include an insulating material such as a silicon oxide layer. The stacked patterns STP may be exposed on the device isolation layer ST. That is, the stacked patterns STP may protrude vertically above the device isolation layer ST.

Figure 8A:
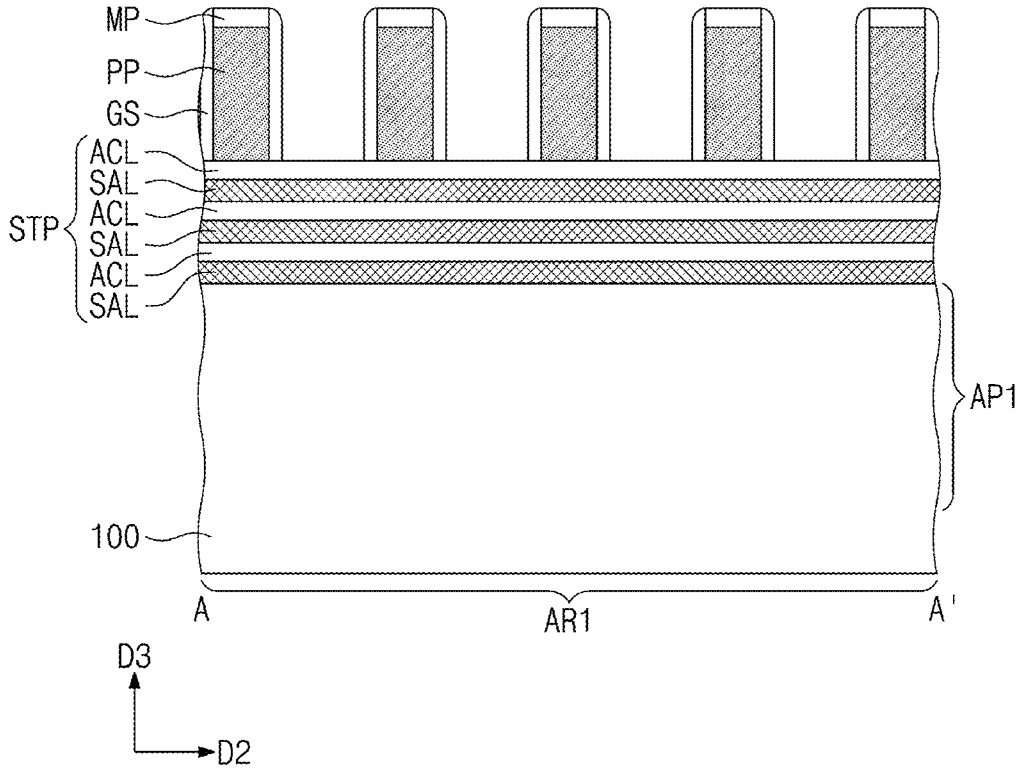
Figure 8B:
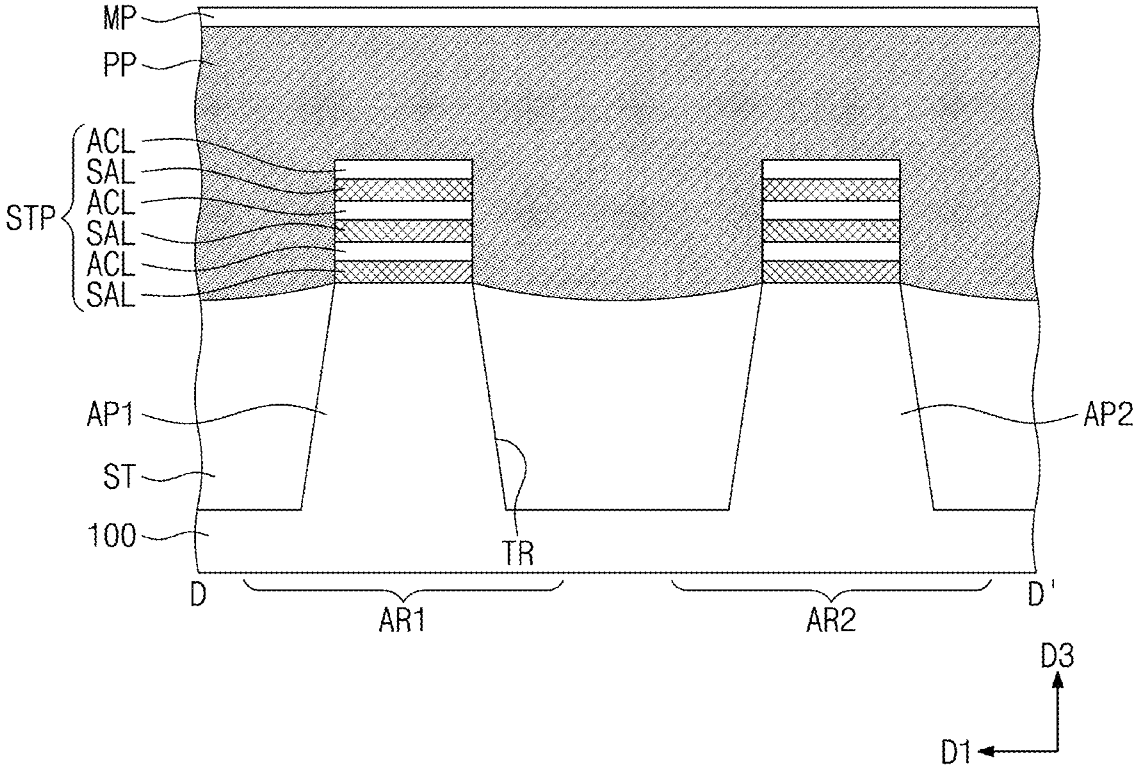

Referring to FIGS. 8A and 8B, sacrificial patterns PP crossing the stacked patterns STP may be formed on the substrate 100. Each of (or alternatively, at least one of) the sacrificial patterns PP may be formed in a line shape or a bar shape extending in a first direction D1. The sacrificial patterns PP may be arranged in the second direction D2 at a first pitch.

In detail, forming the sacrificial patterns PP includes forming a sacrificial layer on the entire surface of the substrate 100, forming hard mask patterns MP on the sacrificial layer, and patterning the sacrificial layer using the hard mask patterns MP as an etch mask. The sacrificial layer may include polysilicon.

A pair of gate spacers GS may be formed on both sidewalls of each of (or alternatively, at least one of) the sacrificial patterns PP. Forming the gate spacers GS may include conformally forming a gate spacer layer on the entire surface of the substrate 100 and anisotropically etching the gate spacer layer. In some example embodiments of the inventive concepts, the gate spacer GS may be a multilayer including at least two layers.

Figure 9A:
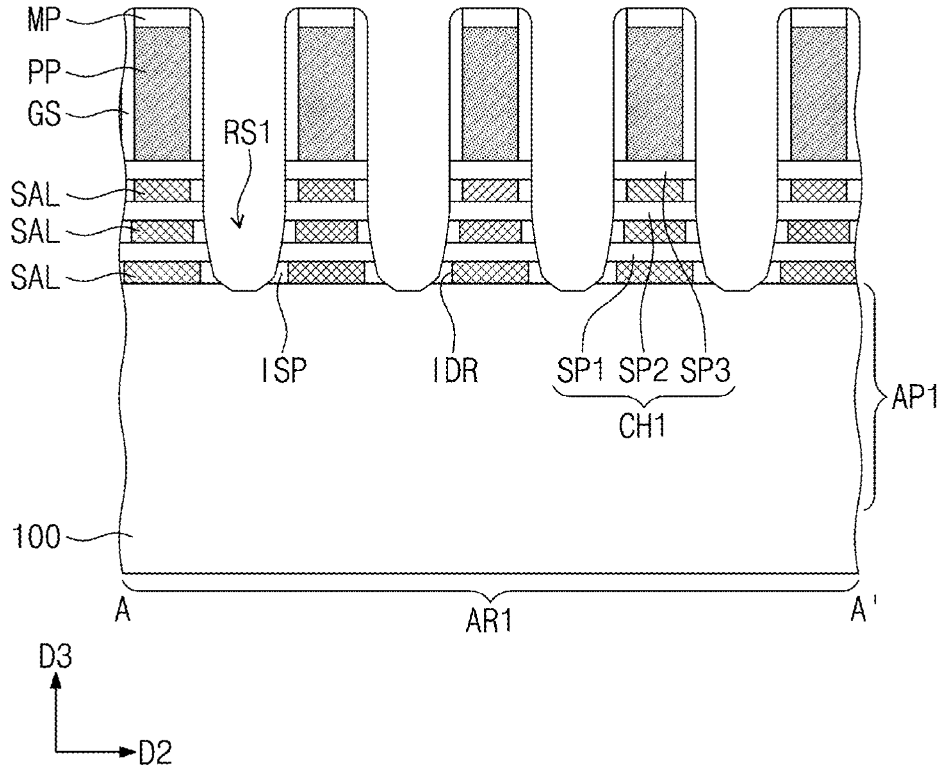
Figure 9B:
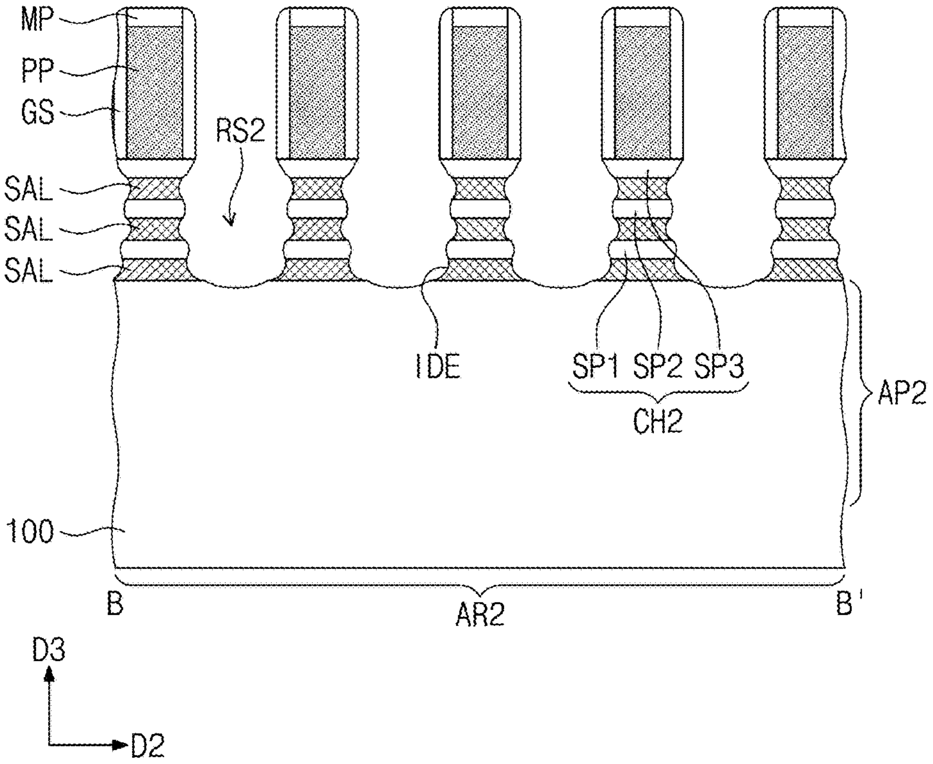
Figure 9C:
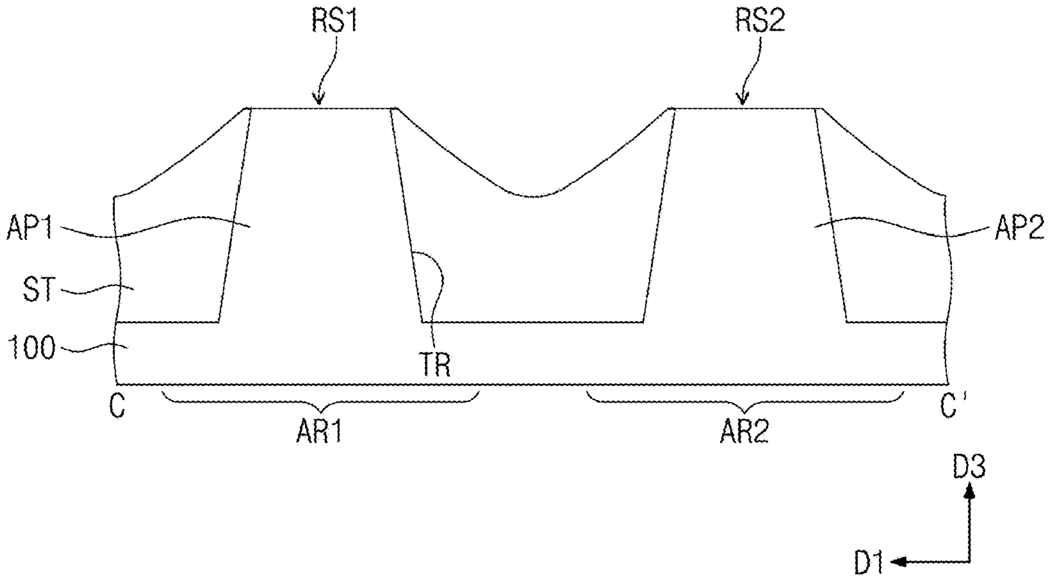

Referring to FIGS. 9A to 9C, first recesses RS1 may be formed in the stacked pattern STP on the first active pattern AP1. Second recesses RS2 may be formed in the stacked pattern STP on the second active pattern AP2. While the first and second recesses RS1 and RS2 are formed, the device isolation layer ST on both sides of each of (or alternatively, at least one of) the first and second active patterns AP1 and AP2 may be further recessed (refer to FIG. 9C).

In detail, the first recesses RS1 may be formed by etching the stacked pattern STP on the first active pattern AP1 using the hard mask patterns MA and the gate spacers GS as an etch mask. The first recess RS1 may be formed between the pair of sacrificial patterns PP.

First to third semiconductor patterns SP1, SP2, and SP3 sequentially stacked between the first recesses RS1 adjacent to each other may be formed from the active layers ACL, respectively. The first to third semiconductor patterns SP1, SP2, and SP3 between the first recesses RS1 adjacent to each other may constitute a first channel pattern CH1.

The first recess RS1 may be formed between the adjacent sacrificial patterns PP. A width of the first recess RS1 in the second direction D2 may decrease as the first recess RS1 approaches the substrate 100.

The sacrificial layers SAL may be exposed by the first recess RS1. A selective etching process may be performed on the exposed sacrificial layers SAL. The etching process may include a wet etching process for selectively removing only silicon-germanium. Each of (or alternatively, at least one of) the sacrificial layers SAL may be indented by the etching process to form an indent region IDR. The sidewall of the sacrificial layer SAL may be concave due to the indent region IDR. An insulating layer filling the indent regions IDR may be formed in the first recess RS1. The first to third semiconductor patterns SP1, SP2, and SP3 and the sacrificial layers SAL exposed by the first recess RS1 may be a seed layer of an insulating layer. The insulating layer may be grown as a crystalline dielectric layer on a crystalline semiconductor constituting the first to third semiconductor patterns SP1, SP2, and SP3 and the sacrificial layers SAL.

An inner spacer ISP may be formed to fill the indent region IDR. In detail, forming the inner spacer ISP may include wet etching an epitaxial dielectric layer until sidewalls of the first to third semiconductor patterns SP1, SP2, and SP3 are exposed. Accordingly, the epitaxial dielectric layer may remain only in the indent region IDR to form the inner spacer ISP.

Referring back to FIGS. 9A to 9C, the second recesses RS2 in the stacked pattern STP on the second active pattern AP2 may be formed in a manner similar to forming the first recesses RS1. A selective etching process may be performed on the sacrificial layers SAL exposed by the second recess RS2 to form indent regions IDE on the second active pattern AP2. Due to the indent regions IDE, the second recess RS2 may have a wavy inner wall. The inner spacers ISP may not be formed in the indent regions IDE on the second active pattern AP2. The first to third semiconductor patterns SP1, SP2, and SP3 between the second recesses RS2 adjacent to each other may constitute a second channel pattern CH2.

Figure 10A:
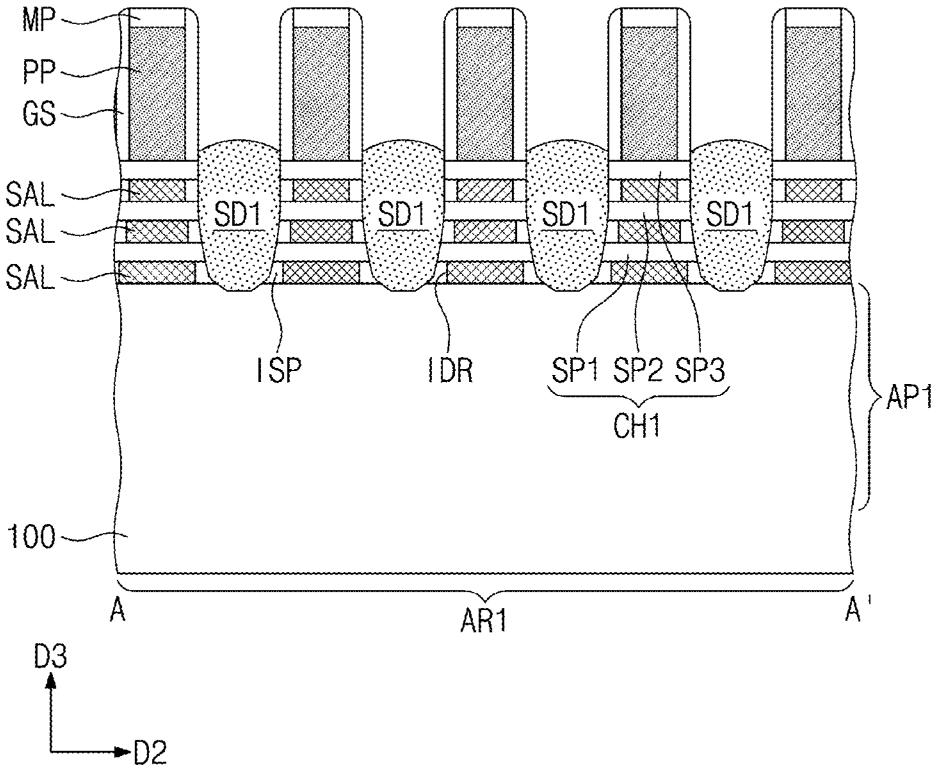
Figure 10B:
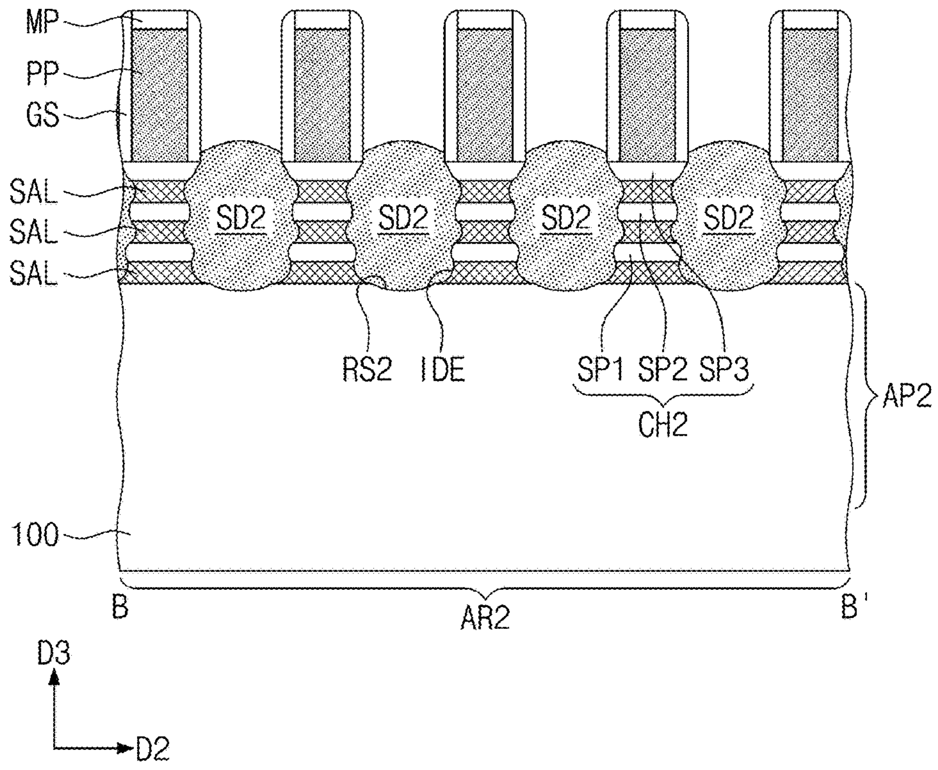
Figure 10C:
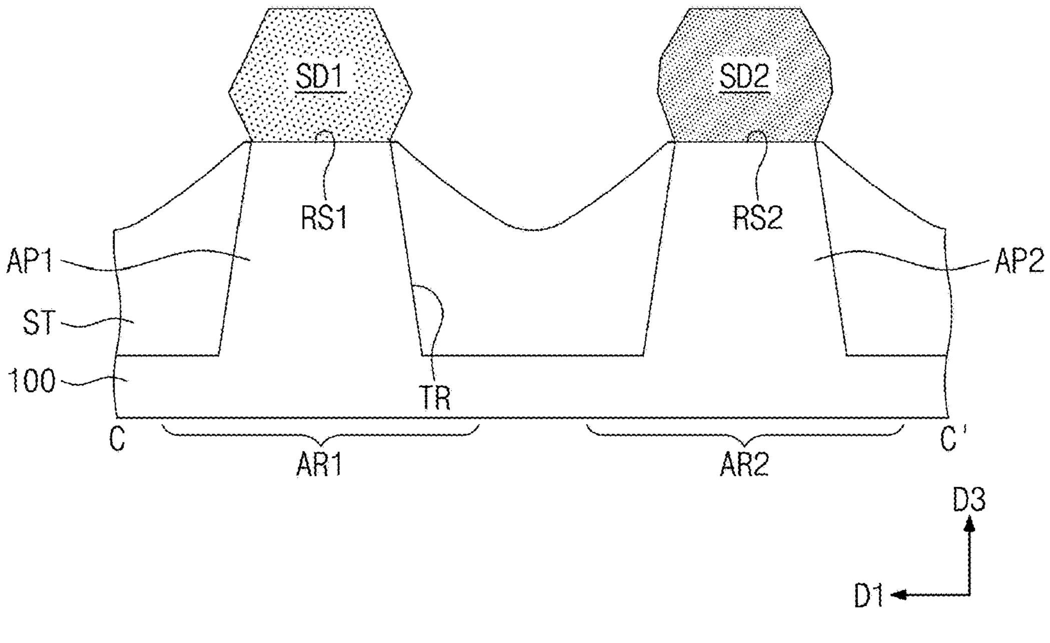

Referring to FIGS. 10A to 10C, first source/drain patterns SD1 may be respectively formed in the first recesses RS1. In detail, an epitaxial layer filling the first recess RS1 may be formed by performing an SEG process using the inner wall of the first recess RS1 as a seed layer. The epitaxial layer may be grown using the first to third semiconductor patterns SP1, SP2, and SP3 and the substrate 100 exposed by the first recess RS1 as seeds. For example, the SEG process may include a chemical vapor deposition (CVD) process or a molecular beam epitaxy (MBE) process.

In some example embodiment of the inventive concepts, the first source/drain pattern SD1 may include the same semiconductor element (e.g., Si) as the substrate 100. While the first source/drain pattern SD1 is formed, impurities (e.g., phosphorus, arsenic, or antimony) that cause the first source/drain pattern SD1 to have an n-type may be implanted in-situ. As another example, after the first source/drain pattern SD1 is formed, impurities may be implanted into the first source/drain pattern SD1.

Second source/drain patterns SD2 may be respectively formed in the second recesses RS2. In detail, the second source/drain pattern SD2 may be formed by performing an SEG process using an inner wall of the second recess RS2 as a seed layer.

In some example embodiment of the inventive concepts, the second source/drain pattern SD2 may include a semiconductor element (e.g., SiGe) having a lattice constant greater than a lattice constant of the semiconductor element of the substrate 100. While the second source/drain pattern SD2 is formed, impurities (e.g., boron, gallium, or indium) that cause the second source/drain pattern SD2 to have a p-type may be implanted in-situ. As another example, after the second source/drain pattern SD2 is formed, impurities may be implanted into the second source/drain pattern SD2.

Figure 11A:
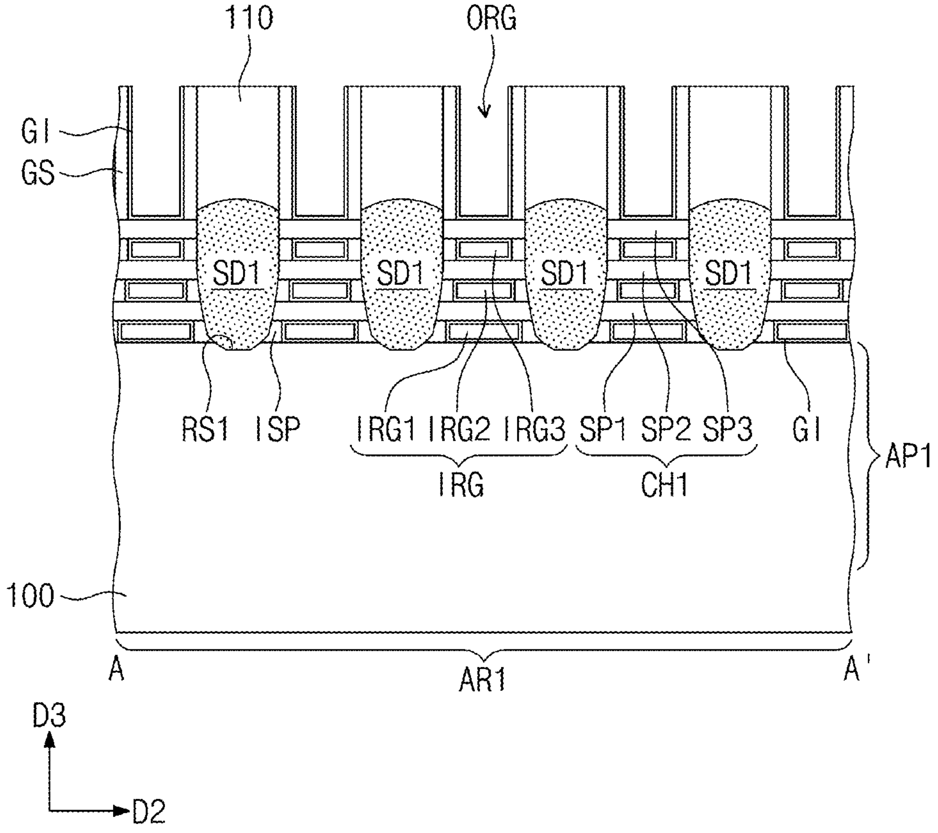
Figure 11B:
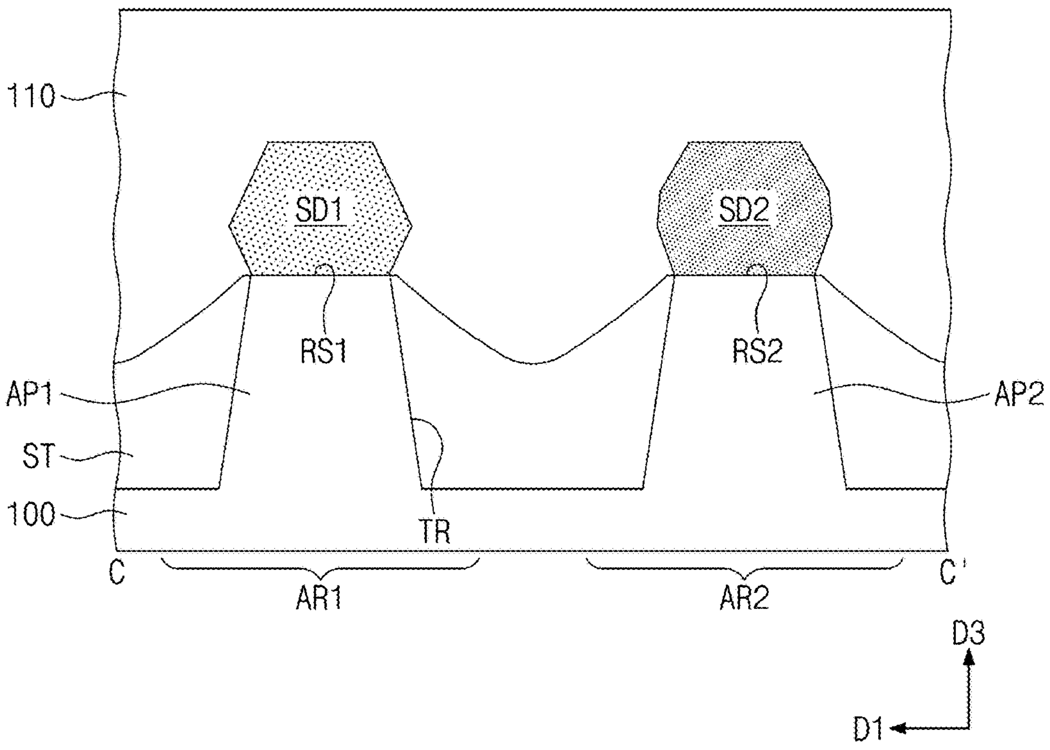
Figure 11C:
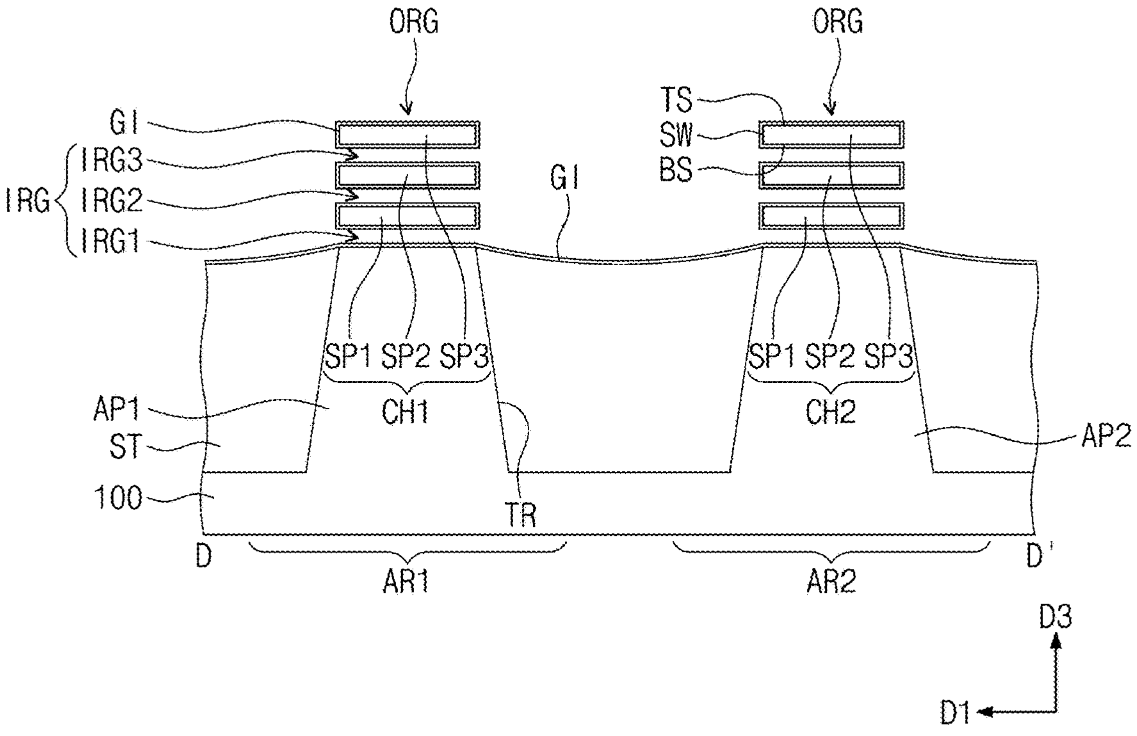

Referring to FIGS. 11A to 11C, a first interlayer insulating layer 110 covering the first and second source/drain patterns SD1 and SD2, the hard mask patterns MP, and the gate spacers GS may be formed. For example, the first interlayer insulating layer 110 may include a silicon oxide layer.

The first interlayer insulating layer 110 may be planarized until top surfaces of the sacrificial patterns PP are exposed. The planarization of the first interlayer insulating layer 110 may be performed using an etch back process or a chemical mechanical polishing (CMP) process. During the planarization process, all of the hard mask patterns MP may be removed. As a result, a top surface of the first interlayer insulating layer 110 may be coplanar with the top surfaces of the sacrificial patterns PP and top surfaces of the gate spacers GS.

The exposed sacrificial patterns PP may be selectively removed. As the sacrificial patterns PP are removed, an outer region ORG exposing the first and second channel patterns CH1 and CH2 may be formed (refer to FIG. 11C). Removing the sacrificial patterns PP may include wet etching using an etchant that selectively etches polysilicon.

The sacrificial layers SAL exposed through the outer region ORG may be selectively removed to form inner regions IRG (refer to FIG. 11C). In detail, an etching process of selectively etching the sacrificial layers SAL may be performed to remove only the sacrificial layers SAL while leaving the first to third semiconductor patterns SP1, SP2, and SP3. The etching process may have a high etch rate with respect to silicon-germanium having a relatively high germanium concentration. For example, the etching process may have a high etching rate for silicon-germanium having a germanium concentration greater than 10 at %.

During the etching process, the sacrificial layers SAL on the first and second active regions AR1 and AR2 may be removed. The etching process may be wet etching. An etching material used in the etching process may rapidly remove the sacrificial layer SAL having a relatively high germanium concentration.

When a selective etching process is performed for the sacrificial layers SAL, a process time may be shortened due to an improved etching selectivity. The etching process may have a higher etch rate for the silicon-germanium-dopant layer than for silicon-germanium having a germanium concentration of 30 at %. That is, as the process time is shortened, only the sacrificial layers SAL may be selectively removed, and loss of the source/drain patterns SD1 and SD2 may be prevented or hindered. As a result, the method of manufacturing the semiconductor device according to the inventive concepts may improve process efficiency. By preventing or hindering loss of the channel patterns and the source/drain patterns, the method of manufacturing the semiconductor device according to the inventive concepts may improve electrical characteristics and yield.

Referring back to FIG. 11C, the sacrificial layers SAL may selectively be removed, and thus the stacked first to third semiconductor patterns SP1, SP2, and SP3 may remain on each of (or alternatively, at least one of) the first and second active patterns AP1 and AP2. First to third inner regions IRG1, IRG2, and IRG3 may be respectively formed through regions from which the sacrificial layers SAL are removed.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A to 11C, a gate insulating layer GI may be formed on the exposed first to third semiconductor patterns SP1, SP2, and SP3. The gate insulating layer GI may be formed to surround each of (or alternatively, at least one of) the first to third semiconductor patterns SP1, SP2, and SP3. The gate insulating layer GI may be formed in each of (or alternatively, at least one of) the first to third inner regions IRG1, IRG2, and IRG3. The gate insulating layer GI may be formed in the outer region ORG.

Figure 12A:
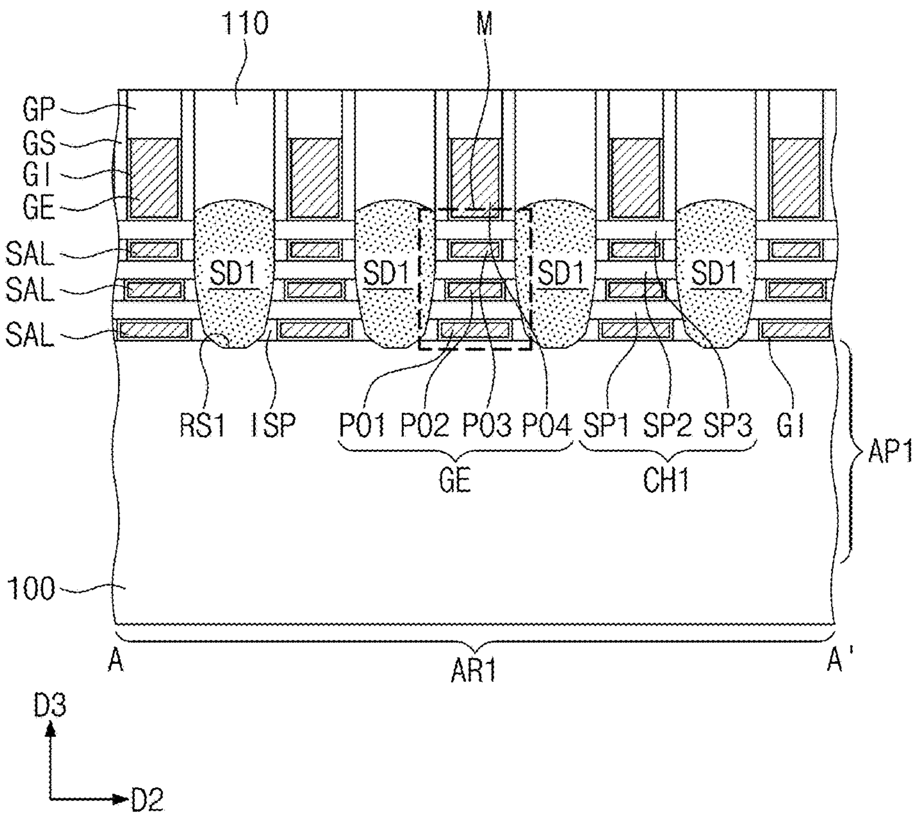
Figure 12B:
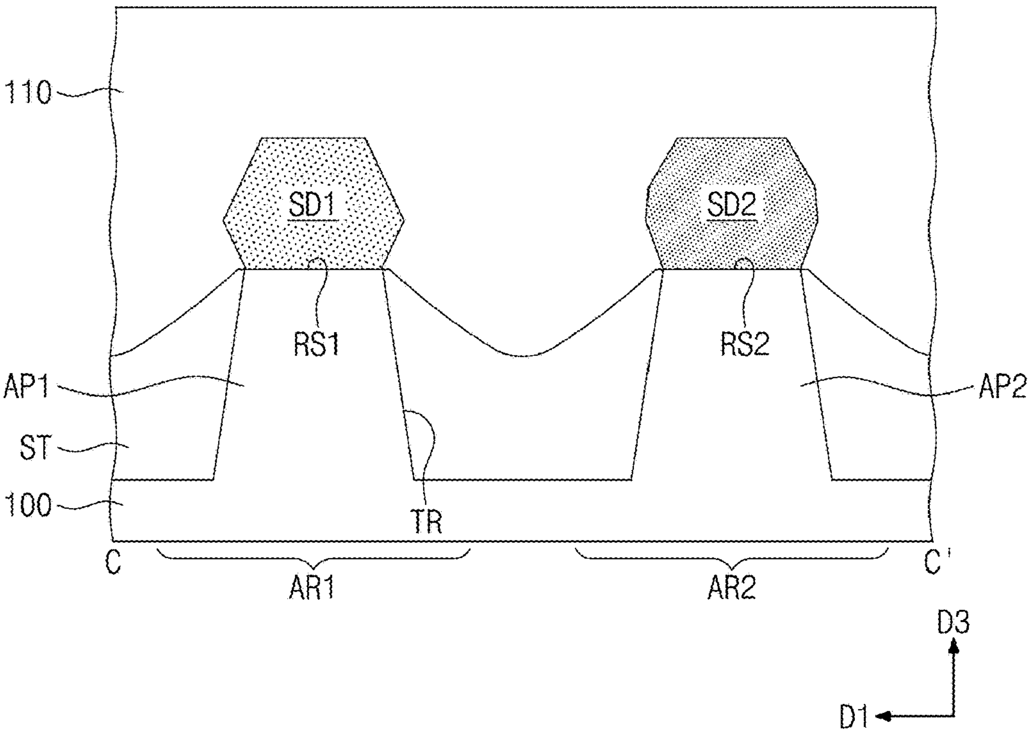
Figure 12C:
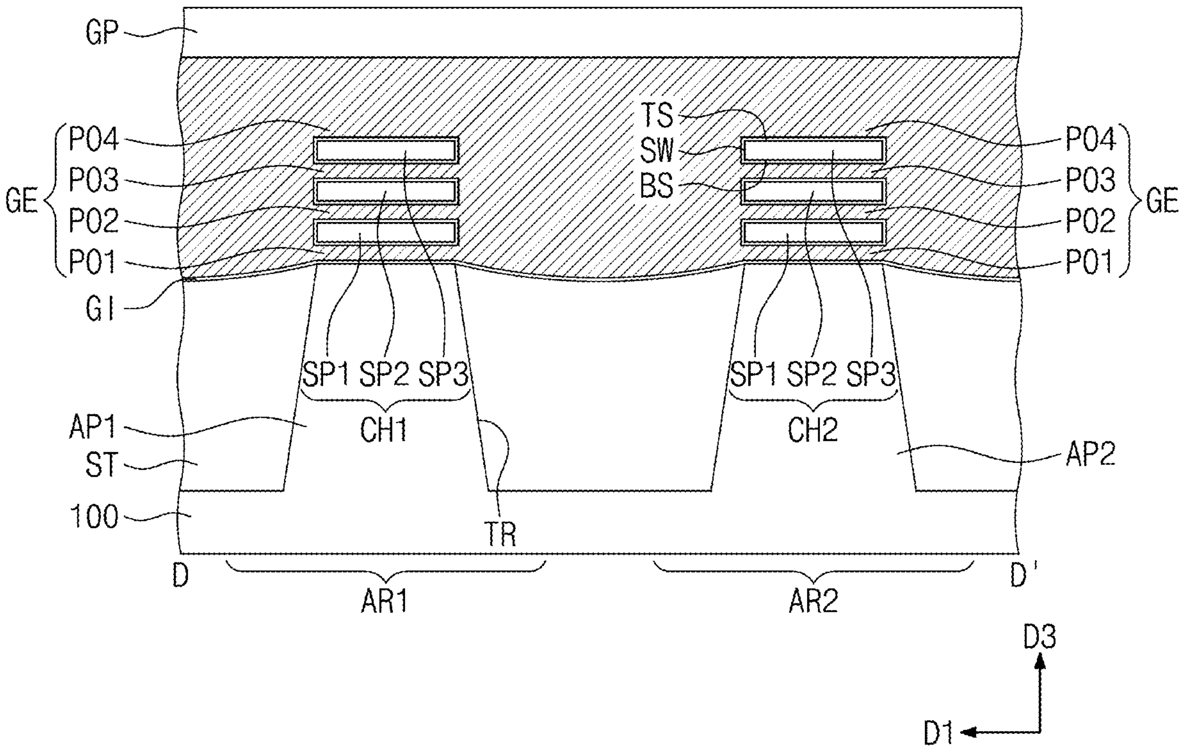

Referring to FIGS. 12A to 12C, a gate electrode GE may be formed on the gate insulating layer GI. The gate electrode GE may include first to third portions PO1, PO2, and PO3 respectively formed in the first to third inner regions IRG1, IRG2, and IRG3, and a fourth portion PO4 formed in the outer region ORG. The gate electrode GE may be recessed, and thus a height thereof may be reduced. A gate capping pattern GP may be formed on the recessed gate electrode GE.

Referring back to FIGS. 5A to 5D, a second interlayer insulating layer 120 may be formed on the first interlayer insulating layer 110. The second interlayer insulating layer 120 may include a silicon oxide layer. Active contacts AC electrically connected to the first and second source/drain patterns SD1 and SD2 may be formed through the second interlayer insulating layer 120 and the first interlayer insulating layer 110. A gate contact GC electrically connected to the gate electrode GE may be formed through the second interlayer insulating layer 120 and the gate capping pattern GP.

Forming each of (or alternatively, at least one of) the active contact AC and the gate contact GC may include forming a barrier pattern BM and forming a conductive pattern FM on the barrier pattern BM. The barrier pattern BM may be conformally formed and may include a metal layer/metal nitride layer. The conductive pattern FM may include a low-resistance metal.

Separation structures DB may be respectively formed on a first boundary BD1 and a second boundary BD2 of a single height cell SHC. The separation structure DB may extend into the active pattern AP1 or AP2 from the second interlayer insulating layer 120 through the gate electrode GE. The separation structure DB may include an insulating material such as a silicon oxide layer or a silicon nitride layer.

A third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Figure 13A:
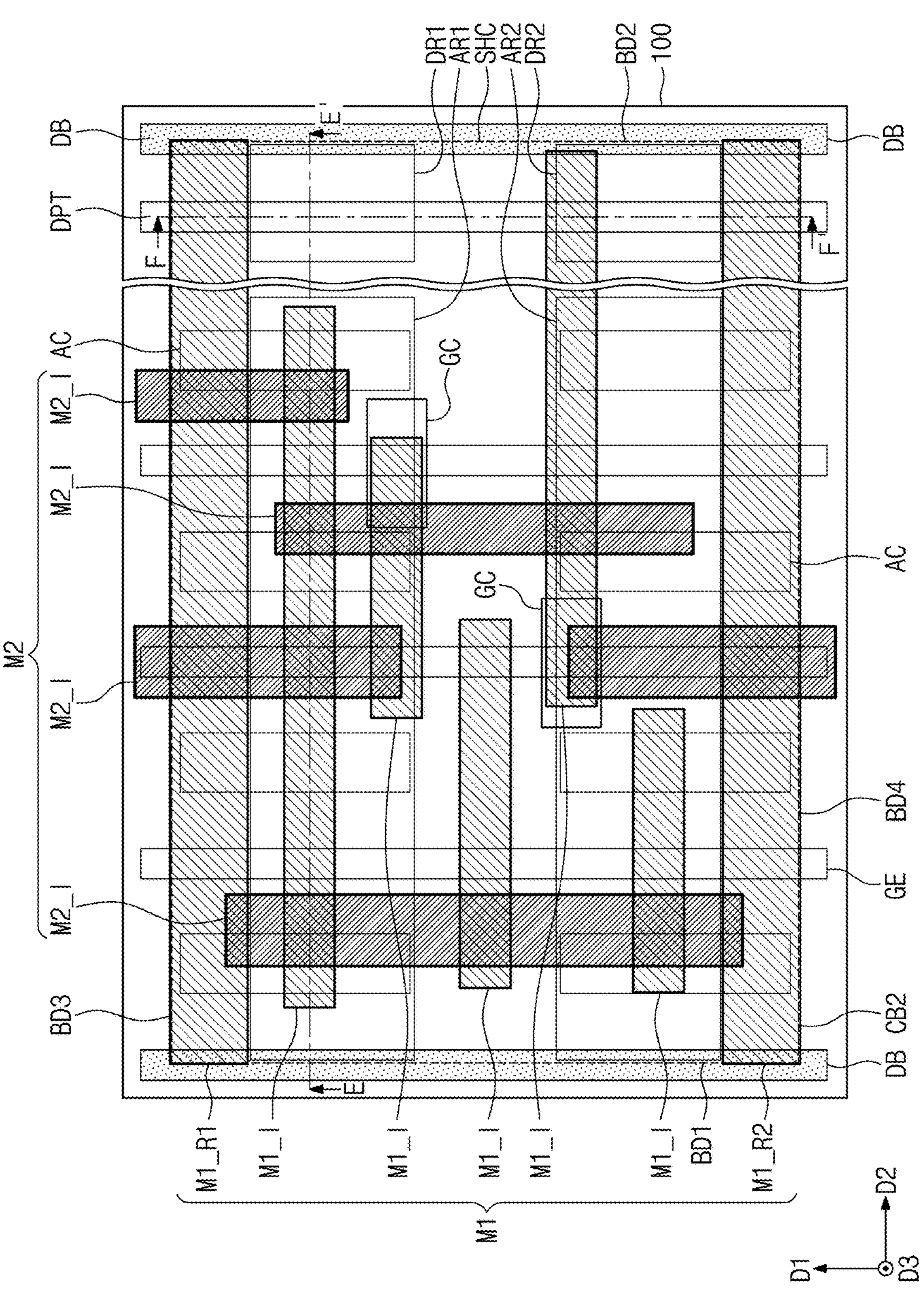
FIG. 13A is a plan view illustrating a semiconductor device according to another example embodiment of the inventive concepts.
Figure 13B:
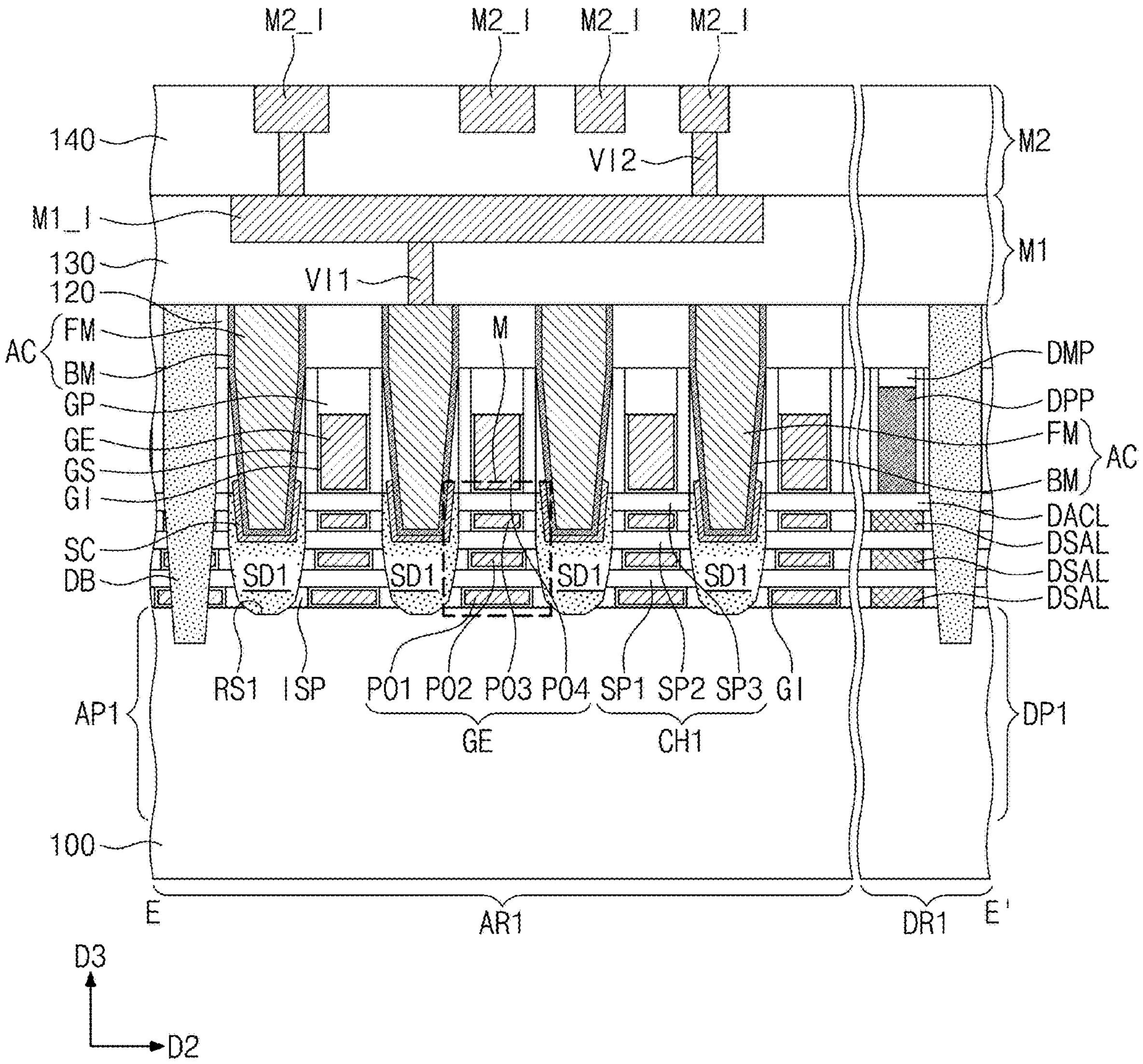
FIGS. 13B and 13C are cross-sectional views taken along lines E-E' and F-F' of FIG. 13A, respectively.
Figure 13C:
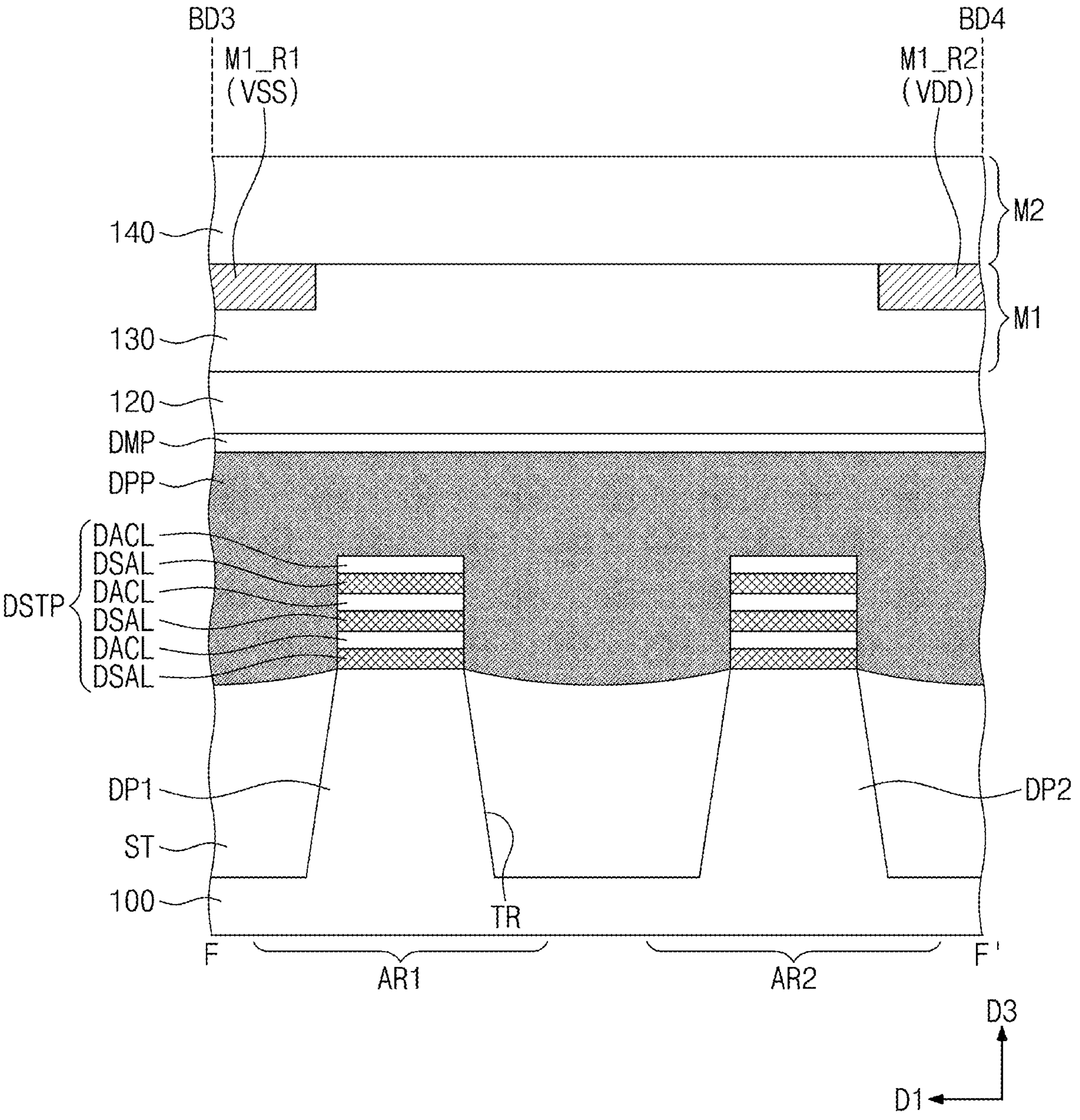

FIG. 13A is a plan view illustrating a semiconductor device according to another example embodiment of the inventive concepts. FIGS. 13B and 13C are cross-sectional views taken along lines E-E' and F-F' of FIG. 13A, respectively. A semiconductor device illustrated in FIGS. 13A to 13C is an example of a single height cell SHC of FIG. 1 in more detail. In some example embodiments to be described later, detailed descriptions of technical features overlapping with those described with reference to FIGS. 1 to 6 will be omitted, and differences will be described in detail.

Referring to FIGS. 13A to 13C, a single height cell SHC may be provided on a substrate 100. Logic transistors constituting a logic circuit may be disposed on the single height cell SHC. The substrate 100 may include a first active region AR1, a second active region AR2, a first dummy region DR1, and a second dummy region DR2. Each of (or alternatively, at least one of) the first and second dummy regions DR1 and DR2 may extend in a second direction D2. In some example embodiments, each of (or alternatively, at least one of) the first and second dummy regions DR1 and DR2 may be a region having a tetragonal shape. Each of (or alternatively, at least one of) the first and second dummy regions DR1 and DR2 may be separated from each of (or alternatively, at least one of) the first and second active regions AR1 and AR2.

A first dummy pattern DP1 and a second dummy pattern DP2 may be defined by a trench TR formed on the substrate 100. The first dummy pattern DP1 may be provided on the first dummy region DR1, and the second dummy pattern DP2 may be provided on the second dummy region DR2.

The first and second dummy patterns DP1 and DP2 may extend in the second direction D2. The first and second dummy patterns DP1 and DP2 may be portions of the substrate 100 and may be vertically protruding portions.

A dummy stacked pattern DSTP may be provided on the first and second dummy patterns DP1 and DP2. The dummy stacked pattern DSTP may include sequentially stacked dummy sacrificial layers DSAL and dummy layers DACL. The dummy sacrificial layers DSAL may be spaced apart from each other in a vertical direction (i.e., a third direction D3). The dummy layers DACL may be spaced apart from each other in the third direction D3.

The dummy sacrificial layers DSAL may correspond to the sacrificial layers SAL of FIG. 7A. The dummy layers DACL may correspond to the active layers ACL of FIG. 7A. That is, the dummy sacrificial layers DSAL may be the same as the sacrificial layers SAL of FIG. 7A or may include the same material as the sacrificial layers SAL of FIG. 7A, and the dummy layers DACL may be the same as the active layers ACL of FIG. 7A or may include the same material as the active layers ACL of FIG. 7A. The same material included in the dummy sacrificial layers DSAL may be a silicon-germanium-dopant layer. For example, the silicon-germanium-dopant layer may be silicon-germanium-antimony (SiGeSb). The dummy layers DACL may be stacked nanosheets.

The dummy stacked pattern DSTP may be disposed adjacent to a separation structure DB. Unlike the example embodiments of the inventive concepts, the dummy stacked pattern DSTP may exist inside the single height cell SHC, and a position thereof may not be limited. The dummy stacked pattern DSTP may be a measurement point (e.g., OS site) for checking components of the semiconductor device according to the inventive concepts.

A dummy sacrificial pattern DPP crossing the dummy stacked pattern DSTP may be provided on the substrate 100. The dummy sacrificial pattern DPP may be formed in a line shape or a bar shape extending in a first direction D1. The dummy sacrificial pattern DPP may be formed like the sacrificial patterns PP of FIG. 8A. The dummy sacrificial pattern DPP may include polysilicon. A dummy mask pattern DMP may be provided on the dummy sacrificial pattern DPP. The dummy mask pattern DMP may be formed like the hard mask patterns MP of FIG. 8A. A pair of dummy spacers may be formed on both sidewalls of each of (or alternatively, at least one of) the dummy sacrificial pattern DPP and the dummy mask pattern DMP. The dummy spacers may be a multilayer including at least two layers.

A passivation layer covering the dummy mask pattern DMP and the dummy spacer may be formed. The passivation layer may include a silicon oxide layer or a silicon nitride layer. The passivation layer may prevent or hinder a planarization process from being performed. That is, the dummy mask pattern DMP and the dummy sacrificial pattern DPP may not be removed, and the dummy stacked pattern DSTP may remain in the single height cell SHC.

The three-dimensional field effect transistor according to the inventive concepts may use the layer doped with the dopant having the atomic weight greater than the atomic weight of silicon (Si) as the sacrificial layer at the high concentration, thereby preventing or hindering the residues from being generated on the channel pattern. In addition, the etching selectivity of the sacrificial layer may be improved compared to the active layer. The inventive concepts may provide the channel pattern with no residue thereon and the source/drain pattern without the lattice defects, thereby improving the electrical characteristics and reliability of the semiconductor device. In addition, the efficiency of the process for manufacturing the semiconductor device according to the inventive concepts may be improved.

While example embodiments are described above, a person skilled in the art may understand that many modifications and variations are made without departing from the spirit and scope of the inventive concepts defined in the following claims. Accordingly, the example embodiments of the inventive concepts should be considered in all respects as illustrative and not restrictive, with the spirit and scope of the inventive concepts being indicated by the appended claims.

What is claimed is:

1. A semiconductor device comprising:

a substrate including an active region and a dummy region;

an active pattern on the active region and a dummy pattern on the dummy region;

a channel pattern and a source/drain pattern on the active pattern, the channel pattern including a plurality of semiconductor patterns spaced apart from each other and vertically stacked;

a dummy stacked pattern on the dummy pattern, the dummy stacked pattern horizontally spaced apart from the channel pattern and the source/drain pattern, and the dummy stacked pattern including a plurality of dummy sacrificial layers and a plurality of dummy layers, wherein the plurality of dummy sacrificial layers and the plurality of dummy layers are alternately stacked; and a gate electrode on the plurality of semiconductor patterns, the gate electrode including an inner electrode interposed between adjacent semiconductor patterns among the plurality of semiconductor patterns, wherein each of the plurality of dummy sacrificial layers includes a dopant having an atomic weight greater than an atomic weight of each of silicon-germanium (SiGe) and silicon (Si), and wherein a concentration of the dopant in the plurality of dummy sacrificial layers is in a range from greater than $1.0\times10^{20}$ atoms/cm$^3$ to $1.0\times10^{21}$ atoms/cm$^3$, wherein the plurality of dummy layers include the dopant diffused from the plurality of dummy sacrificial layers, and wherein a concentration of the diffused dopant is $1.0\times10^{17}$ atoms/cm$^3$ to $1.0\times10^{18}$ atoms/cm$^3$.

2. The semiconductor device of claim 1, wherein the dopant includes at least one of phosphorous (P), arsenic (As), antimony (Sb), bismuth (Bi), sulfur(S), selenium (Se), tellurium (Te), gallium (Ga) and indium (In).

3. The semiconductor device of claim 1, wherein a concentration of germanium (Ge) in each of the plurality of dummy sacrificial layers is 5 at % to 40 at %.

4. The semiconductor device of claim 1, wherein each of the plurality of dummy layers includes undoped silicon (undoped Si).

5. The semiconductor device of claim 1, wherein the dummy stacked pattern includes the plurality of dummy sacrificial layers stacked vertically and overlapping with the plurality of dummy layers, and the dummy stacked pattern includes a silicon-germanium-dopant layer interposed between silicon-germanium (SiGe) layers.

6. The semiconductor device of claim 5, wherein the silicon-germanium-dopant layer does not include silicon-germanium-carbon (SiGeC).

7. The semiconductor device of claim 1, wherein the dummy stacked pattern includes the plurality of dummy sacrificial layers stacked vertically and overlapping with the plurality of dummy layers, and wherein the dummy stacked pattern includes a silicon-germanium-dopant layer and a silicon-germanium layer which are alternately stacked.

8. The semiconductor device of claim 7, wherein the silicon-germanium-dopant layer does not include silicon-germanium-carbon (SiGeC).

9. The semiconductor device of claim 1, wherein the gate electrode further includes a portion interposed between adjacent semiconductor patterns among the plurality of semiconductor patterns, and the semiconductor device further comprises a gate insulating layer between the adjacent semiconductor patterns and the portion of the gate electrode, an inner spacer between the gate insulating layer and the source/drain pattern;

a gate spacer on a sidewall of the gate electrode, a gate capping pattern on a top surface of the gate electrode, a sacrificial pattern on an uppermost dummy layer among the plurality of dummy layers, a mask pattern on the sacrificial pattern, an interlayer insulating layer on the gate capping pattern and the mask pattern, an active contact electrically connected to the source/drain pattern through the interlayer insulating layer, a metal-semiconductor compound layer interposed between the active contact and the source/drain pattern, a gate contact passing through the interlayer insulating layer and the gate capping pattern to be electrically connected to the gate electrode, a first metal layer on the interlayer insulating layer, the first metal layer including a power wiring and first wirings electrically connected to the active contact and the gate contact, respectively, and a second metal layer on the first metal layer, the second metal layer including second wirings electrically connected to the first metal layer.

10. A semiconductor device comprising:

a substrate including an active pattern;

a channel pattern on the active pattern, the channel pattern including a plurality of semiconductor patterns spaced apart from each other and vertically stacked;

a source/drain pattern connected to the plurality of semiconductor patterns; and a gate electrode on the plurality of semiconductor patterns, the gate electrode including a first inner electrode provided below a first semiconductor pattern among the plurality of semiconductor patterns, and a second inner electrode provided above the first semiconductor pattern, wherein the first semiconductor pattern includes a first portion adjacent to the first inner electrode, a second portion adjacent to the second inner electrode, and a third portion between the first portion and the second portion, wherein the first semiconductor pattern includes a dopant having an atomic weight greater than an atomic weight of silicon (Si), wherein a dopant concentration of the third portion is smaller than a dopant concentration of each of the first and second portions, wherein the dopant is diffused into each of the first and second portions of the first semiconductor pattern, and wherein a concentration of the diffused dopant of each of the first and second portions is $1.0\times10^{17}$ atoms/cm$^3$ to $1.0\times10^{18}$ atoms/cm$^3$.

11. The semiconductor device of claim 10, wherein the dopant includes at least one of phosphorous (P), arsenic (As), antimony (Sb), bismuth (Bi), sulfur(S), selenium (Se), tellurium (Te), gallium (Ga) and indium (In).

12. The semiconductor device of claim 10, wherein the third portion includes undoped silicon (undoped Si).

13. The semiconductor device of claim 10, wherein a dopant concentration of an uppermost second semiconductor pattern among the plurality of semiconductor patterns decreases toward an upper portion of the uppermost second semiconductor pattern.

14. The semiconductor device of claim 10, wherein the semiconductor patterns include the first semiconductor pattern with a first width in a first direction and a second semiconductor pattern with a second width in the first direction, the second semiconductor pattern being lower than the first semiconductor pattern, the second width being greater than the first width.

* * * * *